United States Patent
Cho et al.

(10) Patent No.: US 11,145,379 B2
(45) Date of Patent: Oct. 12, 2021

(54) ELECTRONIC FUSE CELL ARRAY STRUCTURE

(71) Applicant: KEY FOUNDRY CO., LTD., Cheongju-si (KR)

(72) Inventors: Jong Min Cho, Cheongju-si (KR); Sung Bum Park, Seongnam-si (KR); Kee Sik Ahn, Hwaseong-si (KR); Seong Jun Park, Suwon-si (KR)

(73) Assignee: Key Foundry Co., Ltd., Cheongju-si (KR)

( * ) Notice: Subject to any disclaimer, the term of this patent is extended or adjusted under 35 U.S.C. 154(b) by 0 days.

(21) Appl. No.: 16/993,380

(22) Filed: Aug. 14, 2020

(65) Prior Publication Data
US 2021/0125678 A1    Apr. 29, 2021

Related U.S. Application Data

(63) Continuation-in-part of application No. 16/848,913, filed on Apr. 15, 2020, now Pat. No. 11,024,398.

(30) Foreign Application Priority Data

Oct. 29, 2019 (KR) .......... 10-2019-0135398
Jun. 19, 2020 (KR) .......... 10-2020-0074807

(51) Int. Cl.
*G11C 17/18* (2006.01)
*H01L 27/112* (2006.01)
*G11C 17/16* (2006.01)

(52) U.S. Cl.
CPC .......... *G11C 17/18* (2013.01); *G11C 17/165* (2013.01); *H01L 27/11206* (2013.01)

(58) Field of Classification Search
CPC .. G11C 17/18; G11C 17/165; H01L 27/11206
USPC .............................................. 365/96, 230.06
See application file for complete search history.

(56) References Cited

U.S. PATENT DOCUMENTS

| | | | | |
|---|---|---|---|---|
| 3,641,516 A | * | 2/1972 | Castrucci | H01L 27/00 365/96 |
| 4,287,569 A | * | 9/1981 | Fukushima | G11C 17/16 365/96 |
| 4,603,404 A | * | 7/1986 | Yamauchi | G11C 29/846 365/200 |
| 4,638,466 A | * | 1/1987 | Fukumoto | G11C 17/18 365/104 |

(Continued)

FOREIGN PATENT DOCUMENTS

KR   10-2013-0090714 A    8/2013

OTHER PUBLICATIONS

Korean Office Action dated Jan. 26, 2021 in counterpart Korean Patent Application No. 10-2019-0135398 (6 pages in Korean).

(Continued)

*Primary Examiner* — Michael T Tran
(74) *Attorney, Agent, or Firm* — NSIP Law

(57) ABSTRACT

An eFuse cell array includes a first unit cell and a second unit cell, each including a PN diode, a cell read transistor, and a fuse element. A first placement order of the PN diode, the cell read transistor, and the fuse element in the first unit cell is reversed with respect to a second placement order of the PN diode, the cell read transistor, and the fuse element in the second unit cell.

30 Claims, 12 Drawing Sheets

(56) References Cited

U.S. PATENT DOCUMENTS

| | | | |
|---|---|---|---|
| 4,654,688 A * | 3/1987 | Fukushima | G11C 17/16 257/517 |
| 4,881,114 A * | 11/1989 | Mohsen | H01L 21/76886 257/530 |
| 6,199,177 B1 * | 3/2001 | Blodgett | G11C 29/808 714/6.32 |
| 6,525,953 B1 * | 2/2003 | Johnson | G11C 17/16 365/63 |
| 7,817,455 B2 | 10/2010 | Fredeman et al. | |
| 8,085,571 B2 | 12/2011 | Worley | |
| 8,514,606 B2 | 8/2013 | Chung | |
| 8,760,904 B2 | 6/2014 | Chung | |
| 8,913,415 B2 | 12/2014 | Chung | |
| 9,053,889 B2 | 6/2015 | Kirihata et al. | |
| 9,082,475 B2 | 7/2015 | Kim | |
| 9,437,274 B1 * | 9/2016 | Kim | G11C 11/406 |
| 9,805,818 B2 | 10/2017 | Kim et al. | |
| 9,830,996 B2 | 11/2017 | Yang | |
| 10,249,379 B2 | 4/2019 | Chung | |
| 2002/0018355 A1 * | 2/2002 | Johnson | G11C 11/5692 365/103 |
| 2008/0251884 A1 * | 10/2008 | Chung | G11C 17/16 257/529 |
| 2008/0315354 A1 * | 12/2008 | Ahn | H01L 23/5256 257/529 |
| 2010/0213529 A1 * | 8/2010 | Rolandi | H01L 21/8221 257/316 |
| 2012/0039107 A1 * | 2/2012 | Chung | G11C 17/12 365/104 |
| 2012/0209888 A1 * | 8/2012 | Chung | G06F 30/30 707/802 |
| 2013/0051113 A1 * | 2/2013 | Kwon | H01L 27/101 365/105 |
| 2013/0215663 A1 * | 8/2013 | Chung | H01L 29/66128 365/100 |
| 2014/0010005 A1 * | 1/2014 | Redaelli | G11C 13/0004 365/163 |
| 2015/0310930 A1 * | 10/2015 | Boldt | G11C 17/18 324/550 |
| 2016/0293612 A1 * | 10/2016 | Park | H01L 27/11206 |
| 2017/0125120 A1 * | 5/2017 | Yang | G11C 17/18 |
| 2017/0352432 A1 * | 12/2017 | Tu | G11C 19/00 |
| 2018/0005703 A1 * | 1/2018 | Chung | H01L 27/224 |
| 2019/0130985 A1 * | 5/2019 | Kim | G11C 17/16 |
| 2019/0371406 A1 * | 12/2019 | Yang | G11C 16/10 |

OTHER PUBLICATIONS

Korean Office Action dated May 13, 2021 in corresponding Korean Patent Application No. KR 10-2021-0037352 (7 pages in Korean).

* cited by examiner

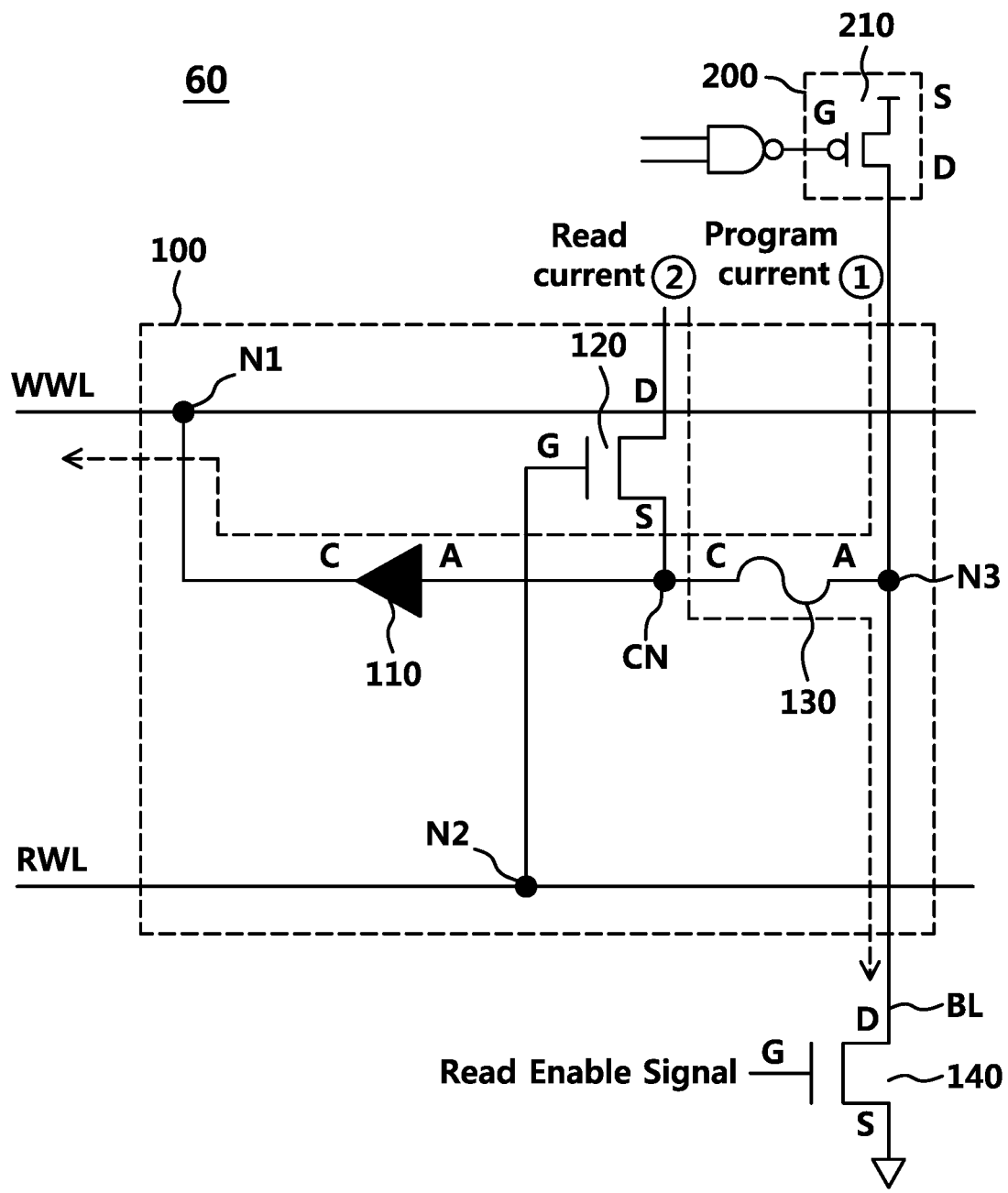

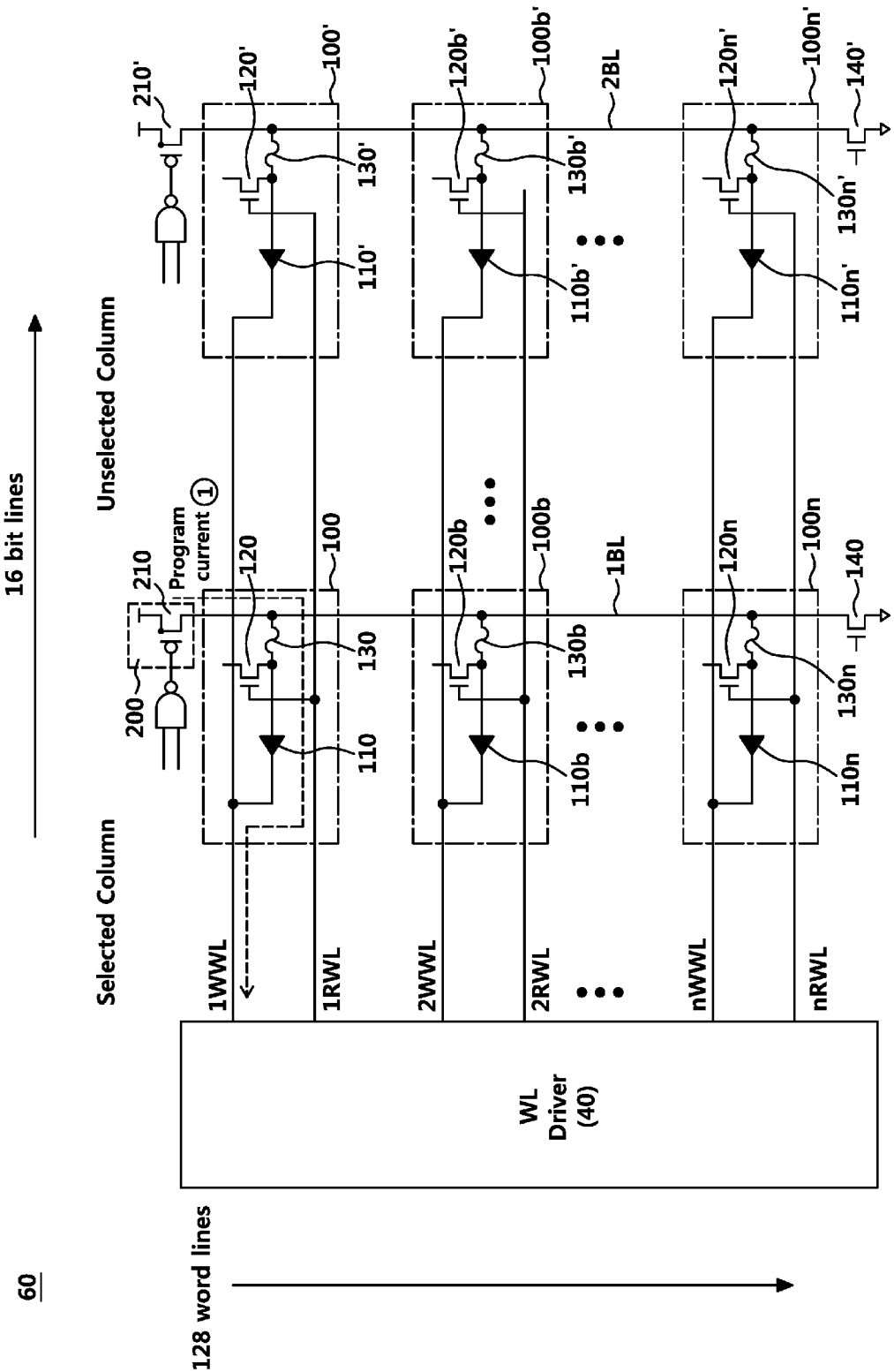

ELECTRONIC FUSE CELL ARRAY STRUCTURE

CROSS-REFERENCE TO RELATED APPLICATIONS

This application claims the benefit under 35 U.S.C. 119(a) of Korean Patent Application No. 10-2020-0074807 filed on Jun. 19, 2020, in the Korean Intellectual Property Office, and is a Continuation-In-Part of U.S. application Ser. No. 16/848,913 filed on Apr. 15, 2020, now U.S. Pat. No. 11,024,398 issued on Jun. 1, 2021, which claims the benefit of Korean Patent Application No. 10-2019-0135398 filed on Oct. 29, 2019, and the entire disclosure of which is incorporated herein by reference for all purposes.

BACKGROUND

1. Field

The following description relates to an electronic fuse (eFuse) cell array structure.

2. Description of Related Art

In very large scale integrated circuits, it is common to have fuses, such as eFuses, that can be programmed for one-time programmable (OTP) memory. A semiconductor chip may include one or more eFuses as an eFuse cell array. An eFuse memory may store data having different logic levels according to a program state of a fuse. The eFuse memory may be used in various devices. For example, when a defective memory cell in a Power Management IC (PMIC) devices is detected, a semiconductor memory device may perform a repair operation by replacing the defective memory cell with a redundant memory cell. EFuses are non-volatile storage elements that include either an anti-fuse, which is a programmable element that provides an initial high resistance and when blown provides a selective low resistance or short circuit; or a fuse element, which is a programmable element that provides an initial low resistance and when blown provides a selective high resistance or open circuit.

The eFuse, as a one-time programmable (OTP) memory, may be programmed if a relatively large current of about 10 to 30 mA passes the eFuse memory element. If the eFuse is programmed or an open circuit, the resistance through the eFuse is more than a few tens of KΩ. In order to make the memory element, eFuse, to be open circuit, a larger programming current may be required, and a metal-oxide-semiconductor (MOS) transistor having large channel width may be required for programming of the OTP memory element, resulting in increasing a chip area of the semiconductor non-volatile memory device. It may be desirable to reduce a size of the OTP memory to have compact design of a non-volatile memory (NVM) semiconductor device.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an eFuse cell array includes a first unit cell and a second unit cell, each including a PN diode, a cell read transistor, and a fuse element. A first placement order of the PN diode, the cell read transistor, and the fuse element in the first unit cell is reversed with respect to a second placement order of the PN diode, the cell read transistor, and the fuse element in the second unit cell.

Each of the first unit cell and the second unit cell may further include a write wordline coupled to a cathode of the PN diode, a read wordline coupled to a gate of the cell read transistor, and a bitline coupled to an anode of the fuse element.

In each of the first unit cell and the second unit cell, a source region of the cell read transistor, an anode of the PN diode and a cathode of the fuse element may be coupled to each other through a common node.

A position of the PN diode in the first unit cell may be diametrically opposed to a position of the PN diode in the second unit cell.

A position of the fuse element in the first unit cell may be diametrically opposed to a position of the fuse element in the second unit cell.

The eFuse cell array may further include a shared read transistor electrically coupled to each of the fuse elements in the first unit cell and the second unit cell. The cell read transistor and the shared read transistor may be NMOS transistors.

The eFuse cell array may further include a shared program transistor electrically coupled to each of the fuse elements in the first unit cell and the second unit cell. The shared program transistor may be a PMOS transistor.

Each of the fuse elements in the first unit cell and the second unit cell may be further electrically coupled to the shared read transistor.

The PN diode may include an N-type doped region in an N-type well region, a P-type doped region in the N-type well region, a trench isolation region surrounding the N-type well region, and a P-type guard ring structure surrounding the trench isolation structure.

The cell read transistor may include a source region and a drain region in a well region, a gate insulating layer and a gate electrode disposed between the source region and the drain region. The source region may be electrically coupled to the P-type doped region of the PN diode.

The fuse element may include a Poly-Si layer formed on an isolation region, and a silicide layer formed on the Poly-Si layer. A cathode of the fuse element may be electrically coupled to the P-type doped region of the PN diode and the source region of the cell read transistor.

In another general aspect, an eFuse cell array includes a write wordline configured for a write operation, a read wordline configured for a read operation, a bitline disposed orthogonally to the write wordline and the read wordline, a PN diode coupled to the write wordline, a cell read transistor coupled to the read wordline, and a fuse element coupled to the bitline.

The write wordline may be coupled to a cathode of the PN diode. The read wordline may be coupled to a gate of the cell read transistor. The bitline may be coupled to an anode of the fuse element.

A source region of the cell read transistor, an anode of the PN diode, and a cathode of the fuse element may be coupled to each other through a common node.

The eFuse cell array may further include a shared read transistor coupled to the fuse element for read operation. A read current may flow through the cell read transistor, the fuse element, and the shared read transistor.

The eFuse cell array may further include a shared program transistor coupled to the fuse element to provide a programming current to the fuse element. The programming current may flow through the shared program transistor, the fuse element and the PN diode, such that the programming current has a current path opposite to that of the read current on the fuse.

The eFuse cell array may further include a sense amplifier configured to determine whether the fuse element is programmed.

The eFuse cell array may further include a read current supplier configured to provide a read current. The read current supplier may include a read current transistor, and a read current resistor coupled to the read current transistor.

The eFuse cell array may further include a reference voltage supplier configured to supply a reference voltage. The reference voltage supplier may include a first reference transistor corresponding to the read current transistor, and a first reference resistor corresponding to the read current resistor.

The reference voltage supplier may further include a second reference transistor corresponding to the cell read transistor, a second reference resistor corresponding to the fuse, and a third reference transistor corresponding to the shared read transistor.

The PN diode may include an N-type doped region in an N-type well region, a P-type doped region in the N-type well region, a trench isolation region surrounding the N-type well region, and a P-type guard ring structure surrounding the trench isolation structure.

The cell read transistor may include a source region and a drain region in a well region, a gate insulating layer and a gate electrode disposed between the source region and the drain region. The source region may be electrically coupled to the P-type doped region of the PN diode.

The fuse element may include a Poly-Si layer formed on an isolation region, and a silicide layer formed on the Poly-Si layer. A cathode of the fuse element may be electrically coupled to the P-type doped region of the PN diode and the source region of the cell read transistor.

The eFuse cell array may further include a wordline driver configured to select one of wordlines in the cell array, a program driver configured to provide a programming current to the fuse, and a control logic configured to control the wordline driver and the program driver.

In another general aspect, an eFuse cell array includes a memory element coupled to a bitline, a diode configured to couple the memory element to a write wordline, a cell read transistor coupled to the memory element and a gate of the cell read transistor coupled to a read wordline, a shared read transistor configured to couple the memory element by the bitline to a ground, and a shared program transistor coupled to the memory element by the bitline.

The eFuse cell array may further include a common node to which a source region of the cell read transistor, an anode of the PN diode, and a cathode of the memory element are coupled.

The write wordline may be coupled to a cathode of the PN diode, and the bitline is coupled to an anode of the fuse.

The memory element may be a one-time programmable (OTP) memory element, and may be one of a fuse or an anti-fuse.

In another genera aspect, an eFuse cell array includes a plurality of unit cells each comprising a memory element coupled to a bitline, a diode configured to couple the memory element to a write wordline, and a cell read transistor coupled to the memory element and a read wordline; a shared read transistor configured to couple the memory element through the bitline to a ground; and a shared program transistor coupled to the memory element through the bitline. A first placement order of the memory element, the cell read transistor, and the diode in odd ones of the plurality of unit cells is reversed with respect to a second placement order of the memory element, the cell read transistor, and the diode in even ones of the plurality of unit cells.

The write wordline may be coupled to a cathode of the diode, the read wordline may be coupled to a gate of the cell read transistor, and the bitline may be coupled to an anode of the memory element.

In each of the plurality of unit cells, a source region of the cell read transistor, an anode of the diode, and a cathode of the memory element may be coupled to each other through a common node.

Other features and aspects will be apparent from the following detailed description, the drawings, and the claims.

BRIEF DESCRIPTION OF THE DRAWINGS

FIG. 3B illustrates a circuit schematic of eFuse cell with read/write current paths, according to an example.

FIG. 4 illustrates a circuit schematic of eFuse cell array for a write operation, according to an example.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
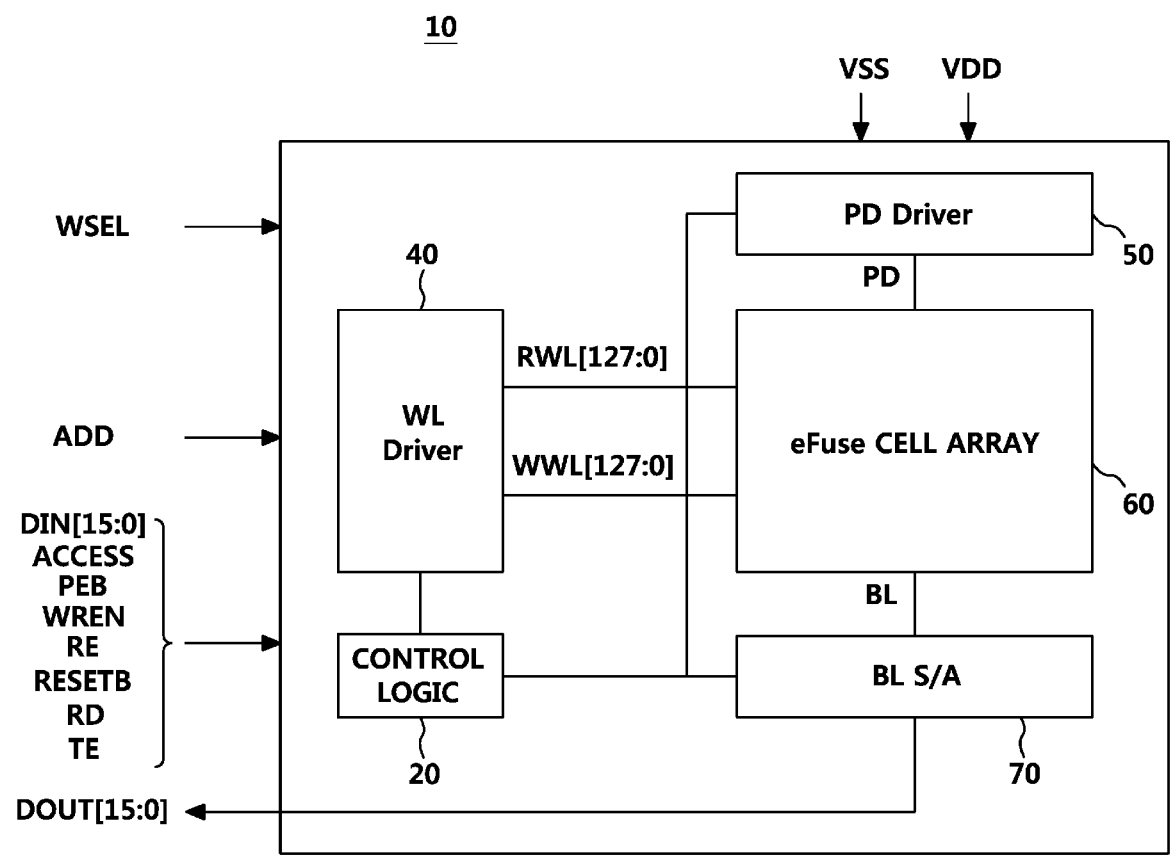
FIG. 1A illustrates a block diagram of a semiconductor device having an eFuse cell array, according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

The present disclosure provides a semiconductor device having an eFuse cell array capable of reducing the footprint of an eFuse cell.

The present disclosure discloses a semiconductor device by designing eFuse cells to be alternately stacked, thereby improving design rule satisfaction and preventing damage to fuses of adjacent cells due to leakage current generated in a program mode.

Hereinafter, the present disclosure is described in more detail based on the example illustrated in the drawings.

FIG. 1A illustrates a block diagram of a semiconductor device having an eFuse cell array, according to an example As illustrated, the semiconductor device 10 may include a control logic 20, a wordline WL driver 40, a programming driver 50, a cell array 60, a sense amplifier 70, and the like. However, it is obvious that the present disclosure is not limited to these configurations, and other configurations may be replaced or added. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The control logic 20 may be configured to supply an internal control signal suitable for a program mode or a read mode based on a control signal. In addition, the control logic 20 may be configured to supply a respective control signal to the wordline (WL) driver 40, the programming driver 50, and the sense amplifier 70. The wordline driver 40 may comprise a wordline selector and may be configured to activate a write wordline (WWL) or a read wordline (RWL). The program driver (PD Driver) 50 may comprise a bitline selector, and it may be configured to supply a programming current controlled by WSEL pins. The eFuse cell array 60 may comprise a plurality of unit cells or bit cells, which is also called eFuse cell array or fuse cell array. The sense amplifier 70 may be configured to sense the current difference between a reference current and a sensed current through the eFuse, producing an output as a digital data. The produced digital data is provided to an output pin DOUT. The sense amplifier is configured to detect whether the eFuse is blown.

In FIG. 1A, RE pin may be configure to activate a read input by providing a read enable signal for a read operation. PEB pin may also be configured to activate a program input by providing a program enable signal for a write operation. The ADD pins may be configured to provide an address selection to the wordline (WL) driver 40. The WSEL pins may be configured to provide a programming current in the programming mode. VDD and VSS pins may be configured to supply an external supply power and ground power, respectively.

The eFuse cell array 60 comprises a plurality of unit cells containing an OTP memory element. For example, an electronic fuse (eFuse) type element or anti-fuse type element may be used for the OTP memory element. In an example, the eFuse type element is an OTP memory element. The eFuse type element may be programmed by applying a high voltage or high current to the eFuse element.

The eFuse cell array 60 comprises 128 rows*16 columns, according to an example. That is, the eFuse cell array 60 may comprise 128 wordlines and 16 bitlines. Therefore, 2048 bit cells or unit cells in total are arranged in the eFuse cell array 60. Each unit cell has an eFuse, which may include an OTP element, a diode, and a read transistor, which is described in further detail in the FIGS. 1C and 1D.

In the present example, one row comprises one write wordline WWL and one read wordline RWL. Therefore, there are 128 WWLs and 128 RWLs. And the WWL and RWL are arranged alternately one-to-one. In the present example, the wordline selector and bitline selector are needed to perform the programming of unit cells. One of the 128 wordlines and one of the 16 bitlines are sequentially selected through row decoding and column decoding. Therefore, the unit cell structure is operated while being sequentially selected.

Figure 1B:
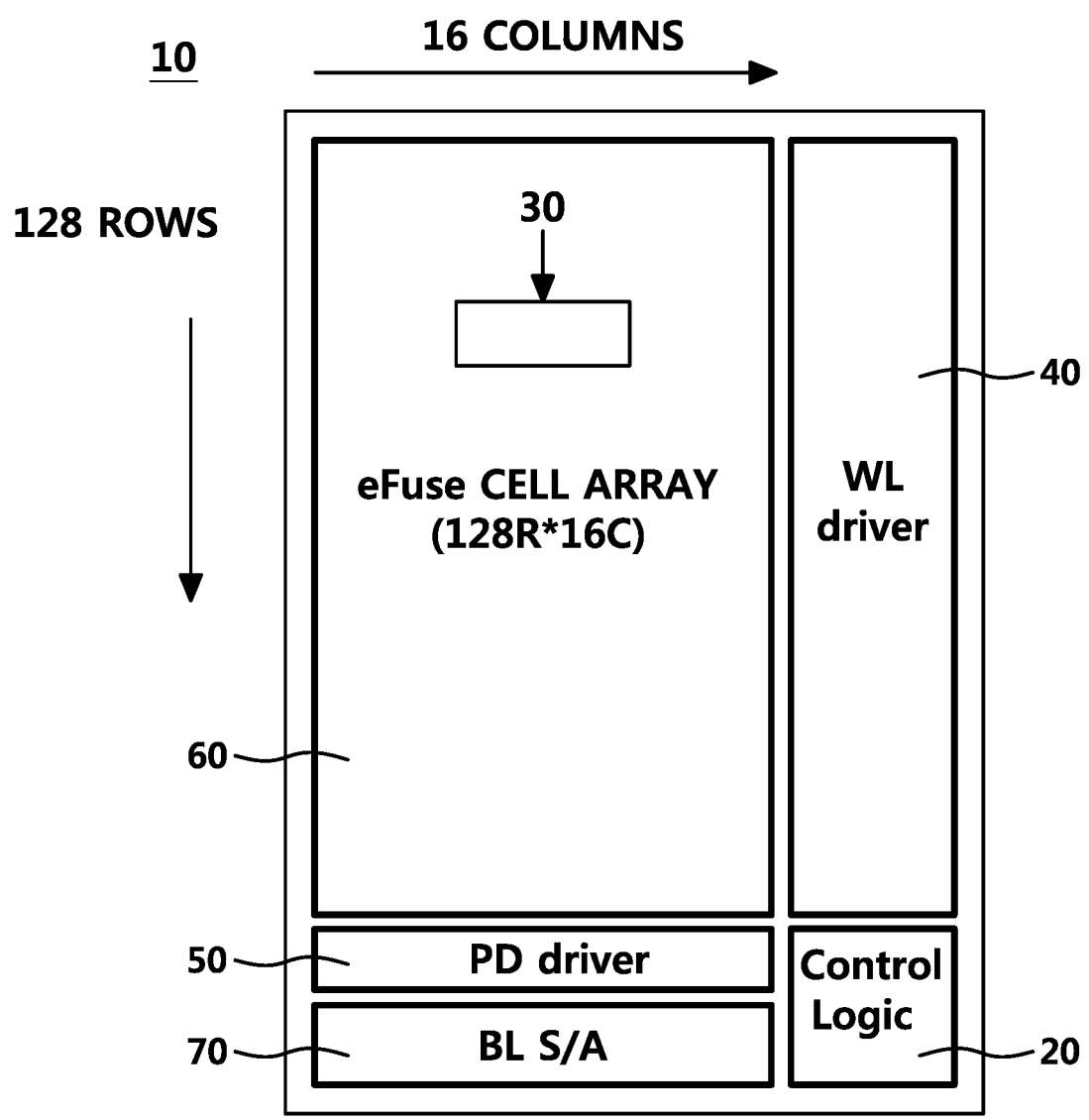
FIG. 1B illustrates a chip layout of a semiconductor device having an eFuse cell array, according to an example.

FIG. 1B illustrates a chip layout of a semiconductor device having an eFuse cell array, according to an example.

As shown in FIG. 1B, the eFuse cell array 60 occupies a relatively larger area than other device areas. A WL driver 40 for selecting each cell of the eFuse cell array is disposed on the right of the eFuse cell array. In addition, for programming or blowing of the fuse element, the PD driver 50 is disposed right below the eFuse cell array. A sense amplifier (BL S/A) 70 associated with a read operation is disposed below the PD driver 50. And a control logic block 20 for controlling both the WL driver 40 and the PD driver 50 is in the right corner. Thus, the semiconductor memory device 10 having a relatively compact chip size is formed. The cell array size may be reduced when compared to a typical cell array size, thereby reducing the overall chip size.

Figure 1C:
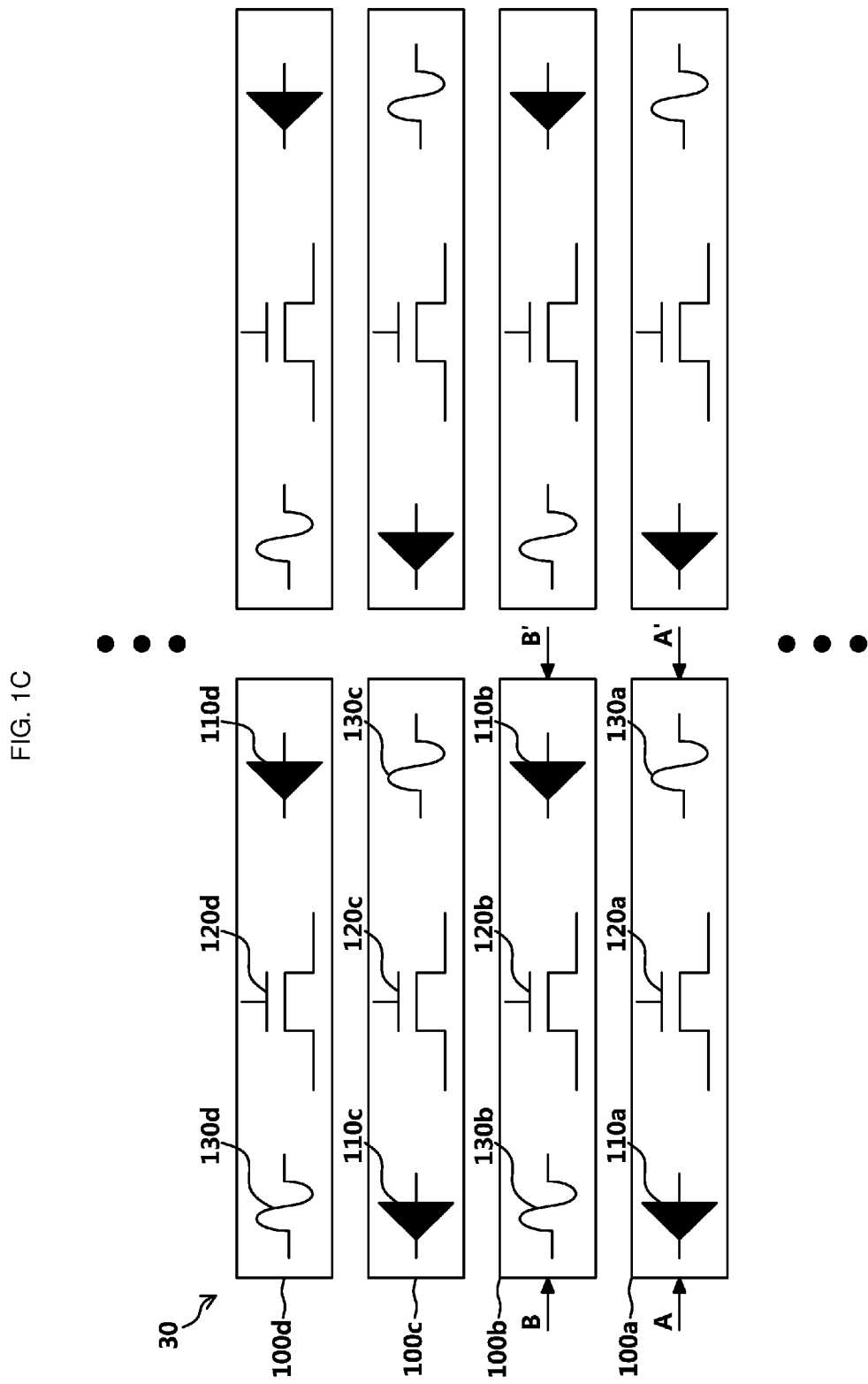
FIG. 1C illustrates a cell layout of eFuse cell array, according to an example.

FIG. 1C illustrates a cell layout of eFuse cell array, according to an example.

As described above, for example, the eFuse cell array 60 comprises a total of 2048 unit cells, and dozens of unit cells are arranged in a box 30. Therefore, FIG. 1C is an enlarged view of the box 30 in which dozens of unit cells are disposed. The unit cells 100a, 100b, 100c, 100d are arranged in parallel. Each unit cell comprises at least three components or three devices: a PN diode, a switching transistor (read transistor), and a fuse.

For example, as shown in FIG. 1C, the first unit cell 100a comprises a first PN diode 110a, a first cell read transistor 120a, and a first memory element 130a. In the same manner, the second unit cell 100b comprises a second PN diode 110b, a second cell read transistor 120b, and a second memory element 130b. With regard to third and fourth unit cells, they have PN diodes 100c and 110d, read transistors 120c, 120d, and memory elements 130c, 130d. Each of the memory elements 130a, 130b, 130c and 130d may be, for example, a fuse or an anti-fuse. According to one embodiment, the memory elements 130a, 130b, 130c and 130d are a one-time-write device, which is written at most once per unit cell.

As illustrated in FIG. 1C, in an example, each of the cell read transistors 120a, 120b, 120c and 120d in the unit cell is fixed in the center. However, the locations of PN diodes 110a, 110b, 110c and 110d are changed from left to right, or from right to left, so that the positions of the PN diodes are alternated to form a zig-zag shape. The locations of the fuses 130a, 130b, 130c and 130d are alternated in a similar manner as the PN diodes.

In an example, the order of the PN diode, the read operation diode and the fuse element in the first unit cell 100a is opposite to that of the second unit cell 100b in the same direction, for example, X-axis. The second unit cell 100b has a reverse order of the first unit cell 100a. In this example, the first unit cell 100a has a first placement order: the first PN diode 110a, the first cell read transistor 120a, and the first memory element 130a from the left to right direction. However, the second unit cell 100b has a second placement order: the second memory element 130a, the second cell read transistor 120a, and the second PN diode 110a from the left to right direction. The placement order of the third unit cell 100c is the same as the first unit cell. The placement order of the fourth unit cell 100d is the same as the second unit cell 100b.

It may be desirable for the first and second PN diodes 110a and 110b to be diagonally disposed to each other in the adjacent unit cells. Therefore, the first and second PN diodes 110a and 110b are disposed to be spaced far apart from each other, as possible. To have a longest distance between the first and second PN diodes, it may be desirable for the first PN diode 110a to be located at a diagonal position with respect to the second PN diode 110b.

If the first and second PN diodes 110a and 110b are disposed relatively spaced from each other as possible, it may be helpful to reduce the NW-to-NW leakage current. For example, the first PN diode 110a is formed in a first NW, and the second PN diode 110b is formed in a second NW. When the first NW and the second NW are close to each other, leakage currents may easily flow to each other. If the leakage current flows from the first PN diode to the second PN diode, the second fuse that is electrically coupled to the second PN diode may be damaged due to an un-programmed second fuse being inadvertently programmed by the leakage current. Thus, the second fuse may malfunction. Therefore, it is desirable to minimize the leakage current between two N-type wells. If the leakage current is reduced, malfunctioning of the fuse element may be abated.

The PN diodes in the remaining unit cells 100c and 100d may be arranged in the same manner as the unit cells 100a and 100b. In an example, the third and fourth PN diodes 110c and 110d of the unit cells adjacent to each other are arranged to be spaced apart from each other. In addition, the third and fourth fuses 130c and 130d are also disposed spaced apart to be diagonal to each other. That is, the fuses of unit cells adjacent to each other may be arranged to be spaced far apart from each other.

Therefore, as illustrated in the example of FIG. 1C, the odd row unit cells 100a and 100c have the same arrangement structure. The even row unit cells 100b and 100d have the same arrangement structure. Correspondingly, odd rows ($1^{st}$, $3^{rd}$, $5^{th}$, etc.) have the same structure with each other, and even rows ($2^{nd}$, $4^{th}$, $6^{th}$ etc.) have the same structure with each other.

Figure 1D:
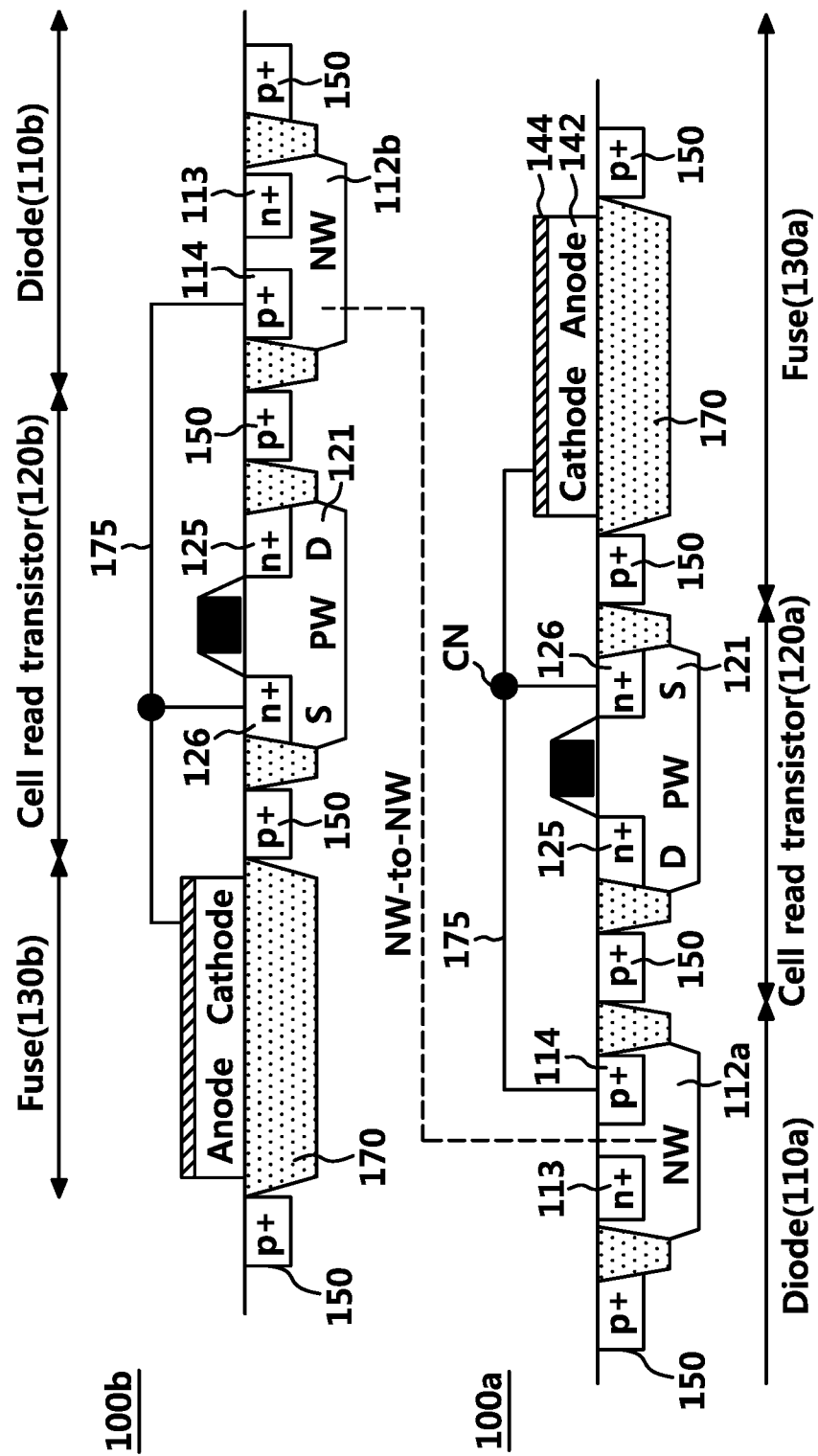
FIG. 1D illustrates a cross-sectional view of two eFuse cells, according to an example.

The semiconductor memory device may comprise a plurality of unit cells to form a cell array, wherein each of the unit cells at least comprises three components comprising: a PN diode; a cell read transistor; and a fuse element, and wherein the unit cells comprise at least a first unit cell and a second unit cell and the first unit cell and the second unit cell are alternately arranged to form the cell array, and wherein a placement order of the three components in the first unit cell is opposite to that in the second unit cell in the same direction FIG. 1D illustrates a cross-sectional view of two eFuse cells, according to an example.

FIG. 1D is a cross-sectional view taken along line A-A' and B-B' of the unit cells 100a and 100b in FIG. 1C. As illustrated, in the present disclosure, the first and second PN diodes 110a and 110b are formed in the first NW 112a and the second NW 112b, respectively. The first NW 112a and the second NW 112b are placed farthest from each other. By disposing the two PN diodes spaced far apart from each other, the leakage current between NW-to-NW (dotted lines) may be reduced.

Since each of the unit cell comprises only three devices: PN diode, read transistor and memory element (fuse), the cell array has a relatively compact area. If the unit cell comprises four devices, the total area of cell array would be larger than the example of the present disclosure.

In addition, as illustrated in FIG. 1D, the first type unit cell 100 is arranged from the left of the drawing in order of the memory element 130, the cell read transistor 120, and the PN diode 110. The second type unit cell 100b is arranged in order of the PN diode 110, the cell read transistor 120, and the memory element 130.

In addition, a cathode (N-type doped region) 113 of the PN diode 110 is coupled to a control logic 20. An anode (P-type doped region) 114 of the PN diode 110 is coupled to an N-type highly doped source region 126 of the cell read transistor 120 and the cathode of the memory element 130 through metal line 175. An N-type highly doped drain region 125 of the cell read transistor 120 is coupled to an input line of the sense amplifier 70 for a read operation (See FIG. 5, for example). In addition, the N-type highly doped source region 126 is coupled to the PN diode 110 and the memory element 130. In addition, the cathode of the memory element 130, using the metal line 175, is coupled to the P+ anode 114 of the PN diode 110 and the N-type highly doped source region 126 of the cell read transistor 120 through a common node CN. In addition, three components in the unit cell 100a are surrounded by a P+ guard ring structure 150.

The second type unit cell 100b has similar structure as the first type unit cell 100a. However, an order of the arrangement of the three components in the second type unit cell 100b is reversed with respect to the first type unit cell 100a.

Figure 2:
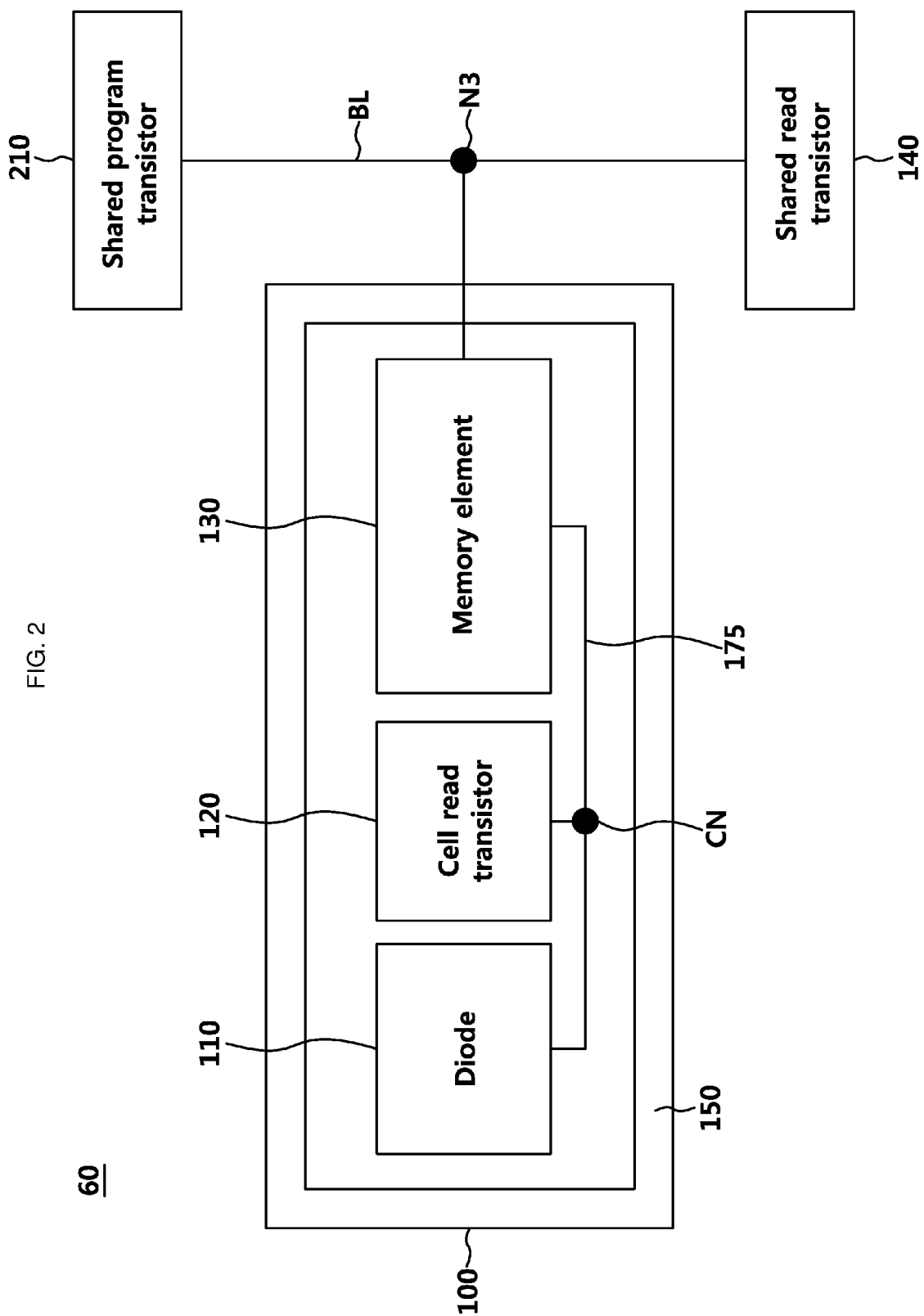
FIG. 2 illustrates a block diagram of eFuse cell array, according to an example.

FIG. 2 illustrates a block diagram of eFuse cell array, according to an example.

As previously described, the eFuse cell array 60 may comprise a plurality of unit cells 100. Each unit cell 100 may comprise a PN diode 110, a cell read transistor (or first read transistor) 120 and a memory element 130. The eFuse cell array 60 may further comprise a shared read transistor (or second read transistor) 140 and a shared program transistor or a program operation transistor or third switching transistor 210 coupled to the memory element 130.

Although the cell read transistor 120 is located in the unit cell 100, the shared read transistor 140 is located outside the unit cell 100, resulting in shrinkage of area occupying the eFuse cell array 60. The shared read transistor 140 is coupled to each eFuse 130 in the unit cells in the same column. That is, the shared read transistor 140 is coupled to a plurality of unit cells 100 through a bitline BL. A plurality of read transistors and a shared read transistor 140 are coupled to the bitline BL.

Typically, a shared read transistor 140 may be comprised in a unit cell 100. However, according to the present disclosure, in order to reduce the size of the unit cell 100, it is designed to exclude the shared read transistor 140 from the unit cell 100. Thus, the size of the unit cell 100 and the size of the eFuse cell array 60, including the unit cell may be reduced. It is effective to reduce the size of the eFuse cell array 60, which occupies the largest area in the chip area.

In FIG. 2, a P-type guard ring 150 is formed to surround the PN diode 110, the cell read transistor 120 and the memory element 130. In addition, the cell read transistor (or first read transistor) 120 and the shared read transistor (or second read transistor) 140 may be an n-type metal oxide semiconductor (NMOS) transistor or NMOS metal oxide semiconductor field transistors (NMOSFETs). The shared program transistor (or third switching transistor) 210 may be a p-type metal oxide semiconductor (PMOS) transistor or a PMOS metal oxide semiconductor field transistor (PMOSFETs).

As illustrated in FIG. 2, the diode 110, the cell read transistor 120, and the memory element 130 included in the unit cell 100 are electrically coupled to each other by a metal wire 175 through a common node CN. In addition, the shared read transistor 140 and the shared program transistor 210 are electrically coupled to the fuse element through the third node N3 of the bitline BL.

Figure 3A:
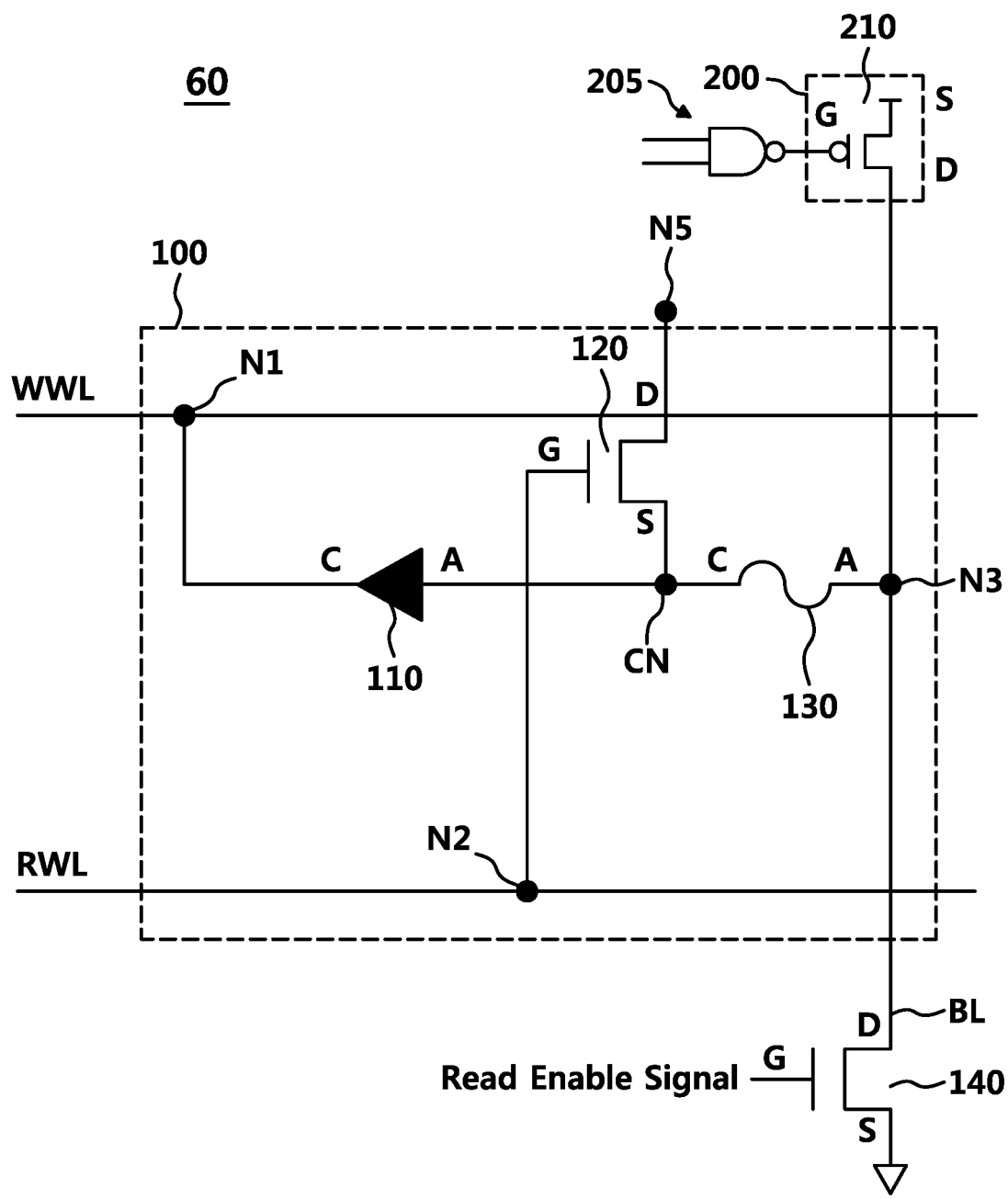
FIG. 3A illustrates a circuit schematic of eFuse cell, according to an example.

FIG. 3A illustrates a circuit schematic of eFuse cell, according to an example.

According to FIG. 3A, as described above, a unit cell 100 comprises three devices, including a PN diode 110, a cell read transistor 120, and a memory element 130. Further, a write wordline WRL, a read wordline RWL, and a program bitline BL are further included.

A cathode C of the diode 110 of unit cell 100 may be configured to receive write word line WWL. A gate G of read transistor 120 of unit cell 100 may be configured to receive read word line RWL.

Program PMOS transistor 210 may be used to program unit cell 100. The program PMOS transistor 210 may be shared by other unit cells in a program operation. A source S of shared program transistor 210 is called the program node for the eFuse array 60, and may be configured to receive program voltage VDD. A drain D of transistor 210 is coupled to node N3 of eFuse 130 of unit cell 100. A gate G of program transistor 210 may be configured to receive a program signal from the NAND gate 205.

Read NMOS transistor 140 may serve as a current path for unit cell 100 to be read. In other words, read transistor 140 may be shared by other unit cells for a read operation. A source S of shared read transistor 140 may be configured to receive reference voltage VSS or ground. A drain D of shared read transistor 140 is coupled to node N3 of eFuse 130 of unit cell 100. A gate G of transistor 140 may be configured to receive a read enable signal.

The write wordline WWL and a cathode C of the PN diode 110 are coupled together at a first node N1. The read wordline RWL and a gate of the cell read transistor 120 are coupled together at a second node N2. The program bitline BL and an anode A of the fuse element are coupled together at a third node N3. In addition, the unit cell 100 further comprises a common node CN. An anode A of the PN diode 110, a source terminal of the cell read transistor 120 and a cathode C of the memory element 130 are coupled together a common node CN.

In this example, the bitline is formed in a direction orthogonal to the write wordline and the read wordline. Thus, the write wordline WWL, the read wordline RWL, and the program bitline BL are respectively coupled to the PN diode 110, the cell read transistor 120, and the memory element 130, respectively.

According to the embodiment, the eFuse cell array further comprises a shared read transistor 140 and a shared program transistor 210, which are formed outside the unit cell 100 area. The shared read transistor 140 is used for a read operation. A read enable signal is applied to the gate terminal of the shared read transistor 140, which operates on/off according to the read enable signal. In this example, the shared read transistor 140 may be an NMOS transistor. A drain terminal of the shared read transistor 140 is coupled to the anode of the memory element 130 through the program bitline BL. A source terminal of the shared read transistor 140 may be configured to receive reference voltage or ground.

The shared program transistor 210 may be configured to provide a programming current in program mode, and located in a programming current controller 200. A NAND gate 205 may be configured to turn-on the shared program transistor 210 in the program mode. The shared program transistor 210 may be in a turn-off state in the read mode. The shared program transistor 210 may be a PMOS transistor. In the case of a PMOS for the shared program transistor 210, the gate-source voltage ($V_{GS}$) is constant, even though the fuse is blown, constant current flows in program mode. If the shared program transistor 210 uses an NMOS, the programming current changes in the program mode because the $V_{GS}$ changes when the fuse element is blown.

The shared read transistor 140 and the shared program transistor 210 are respectively coupled on opposing ends of the bitline 1BL. Here, the memory element 130 in the unit cell 100, the shared read transistor 140, and the shared program transistor 210 are all coupled to each other through the third node N3 of the bitline BL.

FIG. 3B illustrates a circuit schematic of an eFuse cell with read/write current paths, according to an example.

Arrow line 1 illustrates the flow of a programming current when unit cell 100 is programmed. A programming current flows when unit cell 100 is programmed. For example, when unit cell 100 is programmed, read word line RWL of unit cell 100 is deactivated to electrically disconnect read transistor 120 from eFuse 130. Write word line WWL is activated to turn on diode 110. The signal is activated to turn on shared program transistor 210. As a result, current flows from the source S of program transistor 210 through the drain D of transistor 210, eFuse 130, the anode A of diode 110, and the cathode of diode 110, as illustrated by arrow line 1. Current causes fuse eFuse 130 to break or unit cell 100 to be programmed. Alternatively explained, when program transistor 210 and diode 110 are turned on, program voltage VDD at the source S of program transistor 210 is passed to the drain D of transistor 210 to program eFuse 130.

The memory element 130 is programmed or blown by the programming current. Programming or blowing refers to the task of increasing the resistance of the fuse. In the present disclosure, a silicided Poly-Si is used as an electronic fuse (eFuse), and the resistance may be increased by migration in the silicide layer formed on the polysilicon layer. Here, the programming current flows from the anode of the memory element (eFuse) 130 to the cathode. The silicided polysilicon structure, is programmed using electromigration (EM) of the silicide layer from cathode to anode. The programming current then exits through the PN diode and the write wordline WWL. Here, the write wordline is previously selected.

In FIG. 3B, arrow line 2 illustrates the flow of the read current when unit cell 100 is read. For example, when the unit cell 100 is read, write word line WWL of the unit cell 100 is deactivated to electrically disconnect the PN diode 110 from the eFuse 130. Read word line RWL is activated to turn on cell the read transistor 120. Signal is activated to turn on the shared read transistor 140. In a read operation, the program transistor 210 is turned off, and is therefore electrically disconnected from the eFuse 130. Read transistor 120 is turned on. A read current is forced to the drain D of the NMOS transistor 120. Current flows through the transistor 120, eFuse 130, and node N3. As a result, current flows from the drain D of the transistor 120, the source S of transistor 120, the eFuse 130, the drain D of transistor 140, and the source S of transistor 140 or ground, as illustrated by arrow line 2.

A read wordline RWL is selected in advance for a read operation, and a current for a read operation is supplied to the drain terminal of the cell read transistor 120. The read current passes through a memory element 130. The read current varies depending on the resistance of the memory element 130. When the fuse element is blown and the resistance is high, the read current value is small. It may later be converted into a resistance or voltage to see if the fuse element is programmed. And the current passing through the memory element 130 flows through the bitline BL to the shared read transistor 140. Here, the read current flows from the cathode of the memory element 130 to the anode direction, and it may be seen that the read current flows in the opposite direction to the programming current. In addition, because the read current does not pass through the PN diode 110, a high driving voltage may not be required for a read operation. Therefore, a low driving current may be used as a read current. The read current may check whether the memory element 130 is programmed. If the resistance is high in the current path, the selected fuse is assumed to be programmed. If not, it is assumed that it the selected fuse is not programmed.

FIG. 4 illustrates a circuit schematic of eFuse cell array for write operation, according to an example.

As illustrated, the programmable cell array 60 comprises a plurality of unit cells 100a, 100b, 100n, write wordlines 1WWL, 2WWL, nWWL and read wordlines 1RWL, 2RWL, nRWL, and bitlines 1BL, 2BL. In the present example, there are 128 read/write wordlines and 16 bitlines.

For example, in the selected column, the first PN diode 110a is coupled to the first write wordline 1WWL, and the second PN diode 110b is coupled to the second write wordline 2WWL. In the same manner, the $n^{th}$ PN diode 110n in the $n^{th}$ unit cell 100n is coupled to the $n^{th}$ write wordline nWWL.

In the selected column, the first cell read transistor 120a is coupled to the first read wordline 1RWL, and the second cell read transistor 120b is coupled to the second read wordline 2RWL. In the same manner, the $n^{th}$ cell read transistor 120n is coupled to the $n^{th}$ read wordline nRWL.

In the selected column, the first, second and $n^{th}$ fuses 130a, 130b, and 130n are all coupled to only one first bitline 1BL. That is, each of the fuses 130a, 130b, 130n comprises a cathode terminal and an anode terminal, and wherein the anode terminals of the first, second fuses and $n^{th}$ fuses 130a, 130b and 130n are commonly coupled to the same first bitline 1BL.

The PN diode, read transistor and fuse in the unselected column are electrically coupled in the same way as the selected column.

For example, in the unselected column, the first PN diode 110a' is coupled to the first write wordline 1WWL. The second PN diode 110a' is coupled to the second write wordline 2WWL. So the $n^{th}$ PN diode 110' in the $n^{th}$ unit cell 100n is coupled to the $n^{th}$ write wordline nWWL.

In addition, in the unselected column, the first cell read transistor 120a' is coupled to the first read wordline 1RWL, the second cell read transistor 120b' is coupled to the second read wordline 2RWL, and the $n^{th}$ cell read transistor 120n' is coupled to the $n^{th}$ read wordline nRWL.

Also in the unselected column, the first, second and $n^{th}$ fuses 130a', 130b', and 130n' are all coupled to only one second bitline 2BL. That is, the fuses 130a', 130b', and 130n' comprise a cathode terminal and an anode terminal. All of the anode terminal of the first memory element 130a', the anode terminal of the second memory element 130b', and the anode terminal of the $n^{th}$ memory element 130n' are commonly coupled to the same second bitline 2BL.

One of the wordlines is selectively activated by the wordline selector in the WL driver 40. In addition, one of the bitlines is selectively activated by the bitline selector in the PD driver 50.

As illustrated in FIG. 4, the first shared read transistor 140 coupled to the first bitline 1BL is included in the selected column. Also, the unselected column, likewise, comprises a second shared read transistor 140' coupled to the second bitline 2BL.

Each of the shared read transistors 140 and 140' comprises a second source terminal, a second drain terminal, and a second gate terminal. The second drain terminal of the first shared read transistor 140 is coupled to the first bitline 1BL and its second source terminal is grounded. The second shared read transistor 140' has the similar structure as the first shared read transistor 140. In the shared read transistors 140 and 140', the read enable signal is applied to the second gate terminal to control the read operation of the unit cell 100. The read operation is performed by the read enable signal for sensing the read current.

In addition, the eFuse cell array 60 further comprises a programming current controller 200 having shared program transistors 210 and 210'. The programming current controller 200 controls the programming current used for programming the fuse. A program PMOS transistor may be used as the shared program transistor 210. The shared program transistor 210 comprises a third source terminal, a third drain terminal, and a third gate terminal. The third drain terminal of the shared program transistor 210 is coupled to the first bitline 1BL. The program PMOS transistor 210 is shared by unit cells 100, 100b and 100n in a program operation. The source region 215 of shared program transistor 210 is called the program node for the eFuse array 60, and may be configured to receive program voltage VDD (See FIG. 10).

As illustrated in FIG. 4, each unit cell 100 is electrically insulated from other neighboring unit cells by a trench isolation region or another field oxide. Accordingly, leakage current generated between the unit cells may be reduced.

And in an example, the memory element 130 may be a silicided polysilicon (Poly-Si) layer. The silicide layer is formed on the Poly-Si layer. The silicide layer may be one of cobalt silicide (CoSi2), nickel silicide (NiSi), tungsten silicide (WSi) or titanium silicide (TiSi2), but not limited thereto.

The resistance of the fuse element may be changed before and after write or programming operation. For example, before write or programming operation, the resistance of the fuse element may have a resistance value of approximately 300Ω or less. After a write or programming operation, eFuse may have a resistance value of approximately 3 kΩ or more.

In the example of the present disclosure, a program operation of a semiconductor device having an entire eFuse cell array is described.

In this example, the first unit cell 100 is selected for program operation through a selection signal provided from the control logic 20. Then, the cell read transistor 120 and the shared read transistor 140 are turned off, and the shared program transistor 210 is turned on. A program voltage, approximately 3 to 8 V, is applied to a source terminal of the shared program transistor 210, and a programming current flows through the first bitline 1BL, according to a turn-on operation. One WWL can be selected from 128 WWLs by the WL driver. The PN diode 110 and the first bitline 1BL are turned on, so that a programming current flows into the fuse element, and then the fuse element is finally blown (programmed). The programming current sequentially flows through the shared program transistor 210, the first bitline 1BL, the first memory element 130, and the first PN diode 110. The programmed fuse may have a high resistance of approximately 3,000Ω or more.

If the unit cell 100' is not selected during the programming operation, the second PN diode 110' is to protect the second memory element 130'. The second PN diode 110' blocks the current flowing into the second memory element 130' in the second unit cell 100', because the second unit cell 100' is unselected. Thus, the second memory element 130' in the second unit cell 100' can be protected from the program operation conducted in the first unit cell 100.

Figure 5:
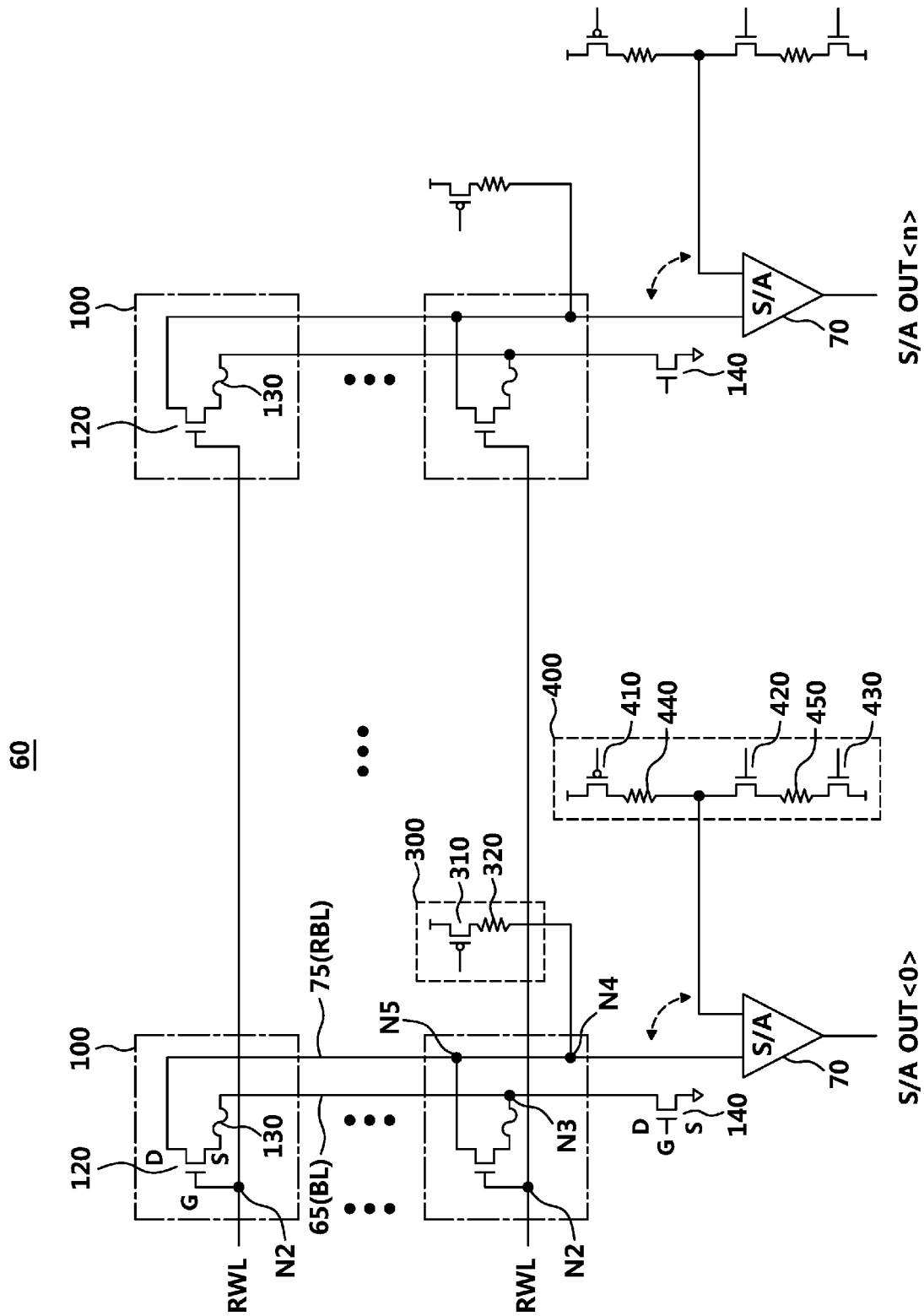
FIG. 5 illustrates a circuit schematic of eFuse cell array for a read operation, according to an example.

FIG. 5 illustrates a circuit schematic of eFuse cell array for a read operation, according to an example.

In FIG. 5, the PN diode 110 is omitted because it is not used during the read operation. For example, when unit cell 100 is read, read word line RWL is activated to turn on cell read transistor 120. The signal is activated to turn on shared read transistor 140. Sense amplifier 70 is turned on. As a result, current flows from sense amplifier 70 through second bit line RBL 75, the drain D of transistor 120, the source S of transistor 120, eFuse 130, the drain D of transistor 140 through the first bit line BL 65, and the source S of transistor 140 or ground.

The sense amplifier 70 may be able to compare the reference resistance and the eFuse resistance in determining the state of the eFuse. An amount of current through from the memory element (eFuse) 130 or an amount of voltage across the eFuse can be measured by a read operation. From the measured current or voltage, the eFuse resistance can be obtained, and it is compared with a reference resistance in the sense amplifier 70. For example, if the eFuse resistance is smaller than that of the reference resistance, it is determined that the selected memory element 130 is not programmed. Conversely, if the eFuse resistance is greater than the reference resistance, the fuse element is determined to be programmed. The reference voltage supplier 400 provides equivalent circuit used for a read operation in the eFuse cell array 60.

During the read operation in the semiconductor memory device, one of 128 RWLs is selected by the wordline driver 40. eFuse information of the 16 cells in the selected RWL is output. To describe the read operation in further detail, the control logic 20 selects the first unit cell 100 to perform the read operation, and provides a selection signal to the first unit cell 100. Then, the cell read transistor 120 and the read current transistor 310 in the read current supplier 300 are turn-on operated. All the switching transistors 410, 420, and 430 provided in the reference voltage supplier 400 are also turn-on operated.

In FIG. 5, the read current supplier 300 serves to provide a read current to the unit cell 100 selected for the read operation. That is, during the read operation of the semiconductor device 10, the read current is provided to the selected unit cell 100. Such a read current supplier 300 comprises a read current transistor 310 and a read current resistor 320, wherein the read current resistor is formed by a non-silicide polysilicon film on insulation layer. Materials other than the non-silicide polysilicon film may be used. To supply the read current, a read voltage according to this configuration may range from approximately 1 to 6V, in a non-limiting example.

When the read current transistor 310 is turned on, the read current flows through the read current transistor 310, the read current resistor 320, the cell read transistor 120, and the memory element 130, and then flows through the shared read transistor 140. The cell read transistor 120 and the read current resistor 320 are electrically coupled to each other by a metal wire 75 or conductor. The metal wire may belong to second bitline 75 for a read operation. So, the second bit line 75 is also called read bitline RBL. In this example, the read bitline RBL 75 is used for only a read operation and not program operation, however, the first bitline 65 (BL) is used for both program and a read operation. Thus, the first bitline 65 is called program bitline (PRL) or read bitline (RBL). The read current is supplied to the drain terminal of the cell read transistor 120. In addition, the selected cell read transistor 120 is turned on, the read current is transferred to the memory element 130 as it is. Since the fuse element 140 is coupled to the drain terminal D of the shared read transistor 140 by the bitline BL, the read current is discharged to ground at the source terminal S of the shared read transistor 140. Here, the voltage across the eFuse element 140 can be measured during the read operation, which depends on the resistance of the eFuse element 140. The sense amplifier 70 compares the measured voltage across the fuse element 140 with the reference voltage to determine whether the fuse element 140 is programmed (or blown) or not. Here, the read current resistor 320 and the drain terminal of cell read transistor 120 are coupled together at fourth node N4. The drain terminal D of the cell read transistor 120 and the sense amplifier 70 are coupled together at a fifth node or read node N5. A drain D of cell read transistor 120 is coupled and form a read node N5 for eFuse cell array 60. Read node N5 is coupled to sense amplifier 70 through read bit line 75.

In addition, the same read current is also supplied to a reference voltage supplier 400, which is configure to supply a reference voltage to the sense amplifier 70. The reference voltage supplier 400 comprises the first reference transistor 410, the first reference resistor 440, the second reference transistor 420, the second reference resistor 450 and the third reference transistor 430. The reference voltage supplier 400 provides equivalent circuit to the current path used for a read operation in eFuse cell array 60.

The following [Table 1] suggests the reference transistors and reference resistors in the reference voltage supplier 400 representing transistors or resistors used for a read operation.

Table 1 shows that first to third reference transistors 410, 420, and 430 respectively represent a read current transistor 310, a cell read transistor 120, and a shared read transistor 140. The first reference resistor 440 represents the read current resistor 320, and the second reference resistor 450 represents the memory element (eFuse) 130.

current resistor 320 may have a predetermined first resistance value. In addition, one end of the read current resistor 320 may be coupled to a fourth drain terminal of the read current transistor 310. The other end of the read current resistor 320 may be commonly coupled to each of the drain terminals of the cell read transistor 120 in the eFuse cell structure 100, through the bitline 220A. The other end of the read current resistor 320 may also be coupled to the bitline sense amplifier 70. The first resistance value of the read current resistor 320 may have an intermediate value about 1600Ω between an un-programmed resistance value, that is, 300Ω or less, and a minimum resistance value, that is, 3000Ω when programmed, in a non-limiting example.

According to the example of FIG. 5, the reference voltage supplier 400 may provide a reference voltage to the bitline sense amplifier 70. The reference voltage supplier 400 may comprise three switching transistors 410, 420 and 430 and two reference resistors 440 and 450 formed using a non-silicided Poly-Si layer. The reference voltage supplier 400 may divide the read voltage using a plurality of resistors coupled in series, and may generate the divided voltage as a reference voltage. The three switching transistors 410, 420 and 430 may be coupled in series. The second reference resistor 440 may be coupled between the first reference transistor 410 and the second reference transistor 420, and the second reference resistor 450 may be coupled between the second reference transistor 420 and the third reference transistor 430.

According to the example of FIG. 5, the first reference transistor 410 may be a PMOS device. With respect to the first reference transistor 410, its source terminal may receive the read voltage, its gate terminal may receive the inverted read control signal, and its drain terminal may be coupled to one end of the first reference resistor 440 to selectively provide a read voltage to the first reference resistor 440. The second reference transistor 420 may selectively couple the first reference resistor 440 and the second reference resistor 450. That is, the second reference transistor 420 may be an NMOS having a drain terminal commonly coupled to the first reference resistor 440 and the sense amplifier 70, a gate terminal inputted with a read control signal, and a source terminal coupled to a second reference resistor 450. The third reference transistor 430 may be an NMOS whose drain terminal is coupled to the second reference resistor 450, a gate terminal receives a read control signal, and a source

TABLE 1

| No | Reference Device | Corresponding Device | Type |
|---|---|---|---|
| 1 | First reference transistor 410 | Read current transistor 310 | PMOS |
| 2 | Second reference transistor 420 | Cell read transistor 120 | NMOS |
| 3 | Third reference transistor 430 | Shared read transistor 140 | NMOS |
| 4 | First reference resistor 440 | Read current resistor 320 | Resistor |
| 5 | Second reference resistor 450 | Memory element 130 | Resistor |

The first reference transistor 410 and the corresponding read current transistor 310 may be PMOS devices, such as to minimize mismatching characteristics otherwise occurring during the reading operation. The second and third reference transistors 420 and 430 and the corresponding shared read transistors 120 and 140 may be NMOS transistors to minimize mismatching characteristics otherwise occurring during the reading operation. As a result of using these approaches in examples, mismatching characteristics may be minimized during the reading operation.

According to the example of FIG. 5, the read current transistor 310 may be a P-channel MOS transistor. The read terminal is grounded, such that current flows through the first reference resistor 440 and the second reference resistor 450 due to the read voltage.

According to the example of FIG. 5, two resistors provided in the reference voltage supplier 400, that is, the first reference resistor 440 and the second reference resistor 450, may each have a predetermined resistance value, respectively. The predetermined resistance value may be between resistance values in a non-programmed state and a programmed state. In a non-limiting example, each resistance value may have an intermediate value of 1500 to 5000Ω between the resistance value in a non-programmed state of about 50-200Ω and a minimum resistance value in a programmed state of about 3000-10000Ω of the eFuse 140.

Next, a cross-sectional view of each device is described.

Figure 6:
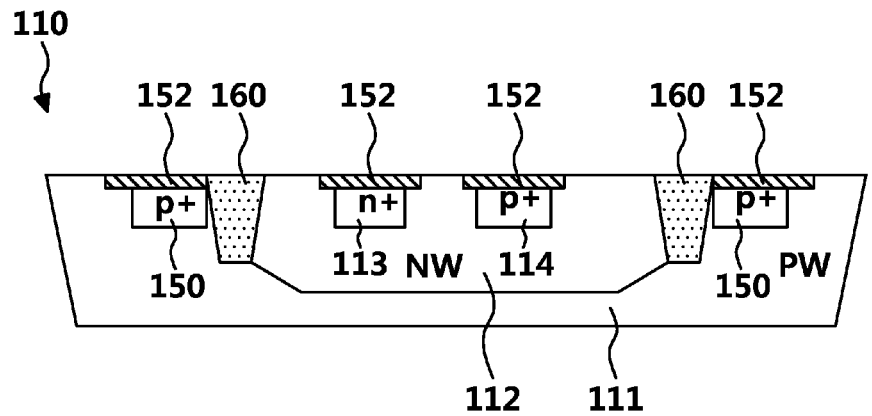
FIG. 6 illustrates a cross-sectional view of a PN diode in the eFuse cell, according to an example.

FIG. 6 illustrates a cross-sectional view of a PN diode in the eFuse cell, according to an example.

As illustrated, P-type well region 111 is formed on the semiconductor substrate, and an N-type well region 112 is formed in the P-type well region 111. An N+ cathode 113 and a P+ anode 114 are formed spaced each other in the N-type well region 112 and each having at a predetermined depth. A trench isolation region 160 is formed to surround the N+ cathode 113 and the P+ anode 114 formed in the N-type well region 112. In addition, a P− type guard ring 150 with a silicide layer 152 is formed in the P-type well region 111 to surround PN diode structure 110 and it is disposed adjacent to the trench isolation region 160. In addition, silicide layers 152 are formed on the N+ cathode 113 and the P+ anode 124 in the PN diode. A contact plug and a metal portion may be formed on each silicide layers 152.

Figure 7:
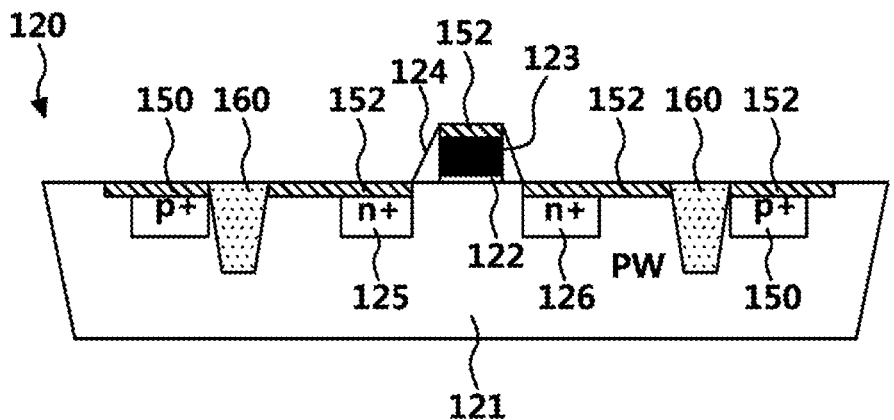
FIG. 7 illustrates a cross-sectional view of a cell read transistor in the eFuse cell, according to an example.

FIG. 7 illustrates a cross-sectional view of a cell read transistor in the eFuse cell, according to an example.

A P-type well region 121 is formed in the semiconductor substrate. In addition, a gate insulating film 122 and a gate electrode 123 are formed on the P-type well region 121. A spacer 124 is formed on a sidewall of the gate electrode 123. An n+ drain region 125 and an n+ source region 126 are formed in the P-type well region 121 on both of the gate electrode 123. The silicide layer 152 is formed on the gate electrode 123, the n+ drain region 125 and the n+ source region 126. In addition, the p+ guard ring 150 is also formed in the P-type well region 121, and the trench isolation region 160 is formed to surround the cell read transistor 120.

Figure 8:
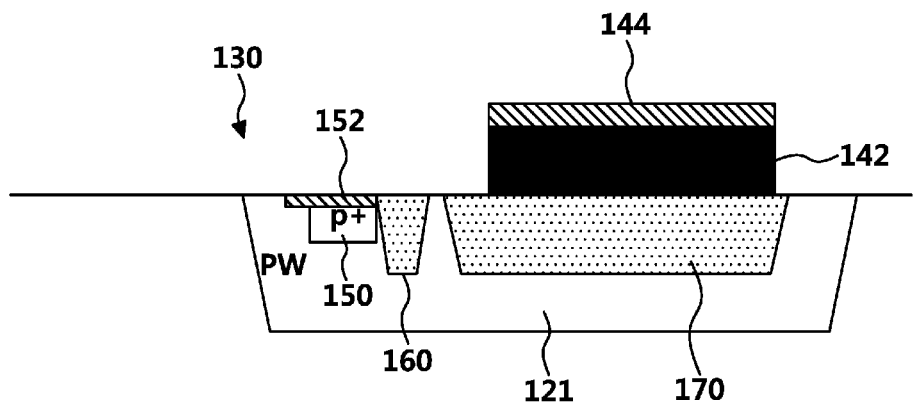
FIG. 8 illustrates a cross-sectional view of an eFuse element in the eFuse cell, according to an example.

FIG. 8 illustrates a cross-sectional view of an eFuse element in the eFuse cell, according to an example.

The memory element 130 may be a Poly-Si fuse, including a silicide layer 144 formed on the polysilicon material 142. The silicide layer 144 may use one of cobalt silicide, nickel silicide and titanium silicide, but not limited thereto. A contact plug for an anode and a contact plug for a cathode may be formed in the memory element 130, and a metal portion is formed thereon. The memory element 130 has an anode and a cathode. The anode and the cathode are formed to be insulated from the semiconductor substrate by an insulating film. A trench-type fuse isolation region 170 having a predetermined depth is formed in the P-type well region 121 located in a lower part of the memory element 130. The lateral length of trench-type fuse isolation region 170 is longer than that of the memory element 130. In addition, the guard ring 150 with the silicide layer 152 is also formed adjacent to the trench isolation region 160.

Figure 9:
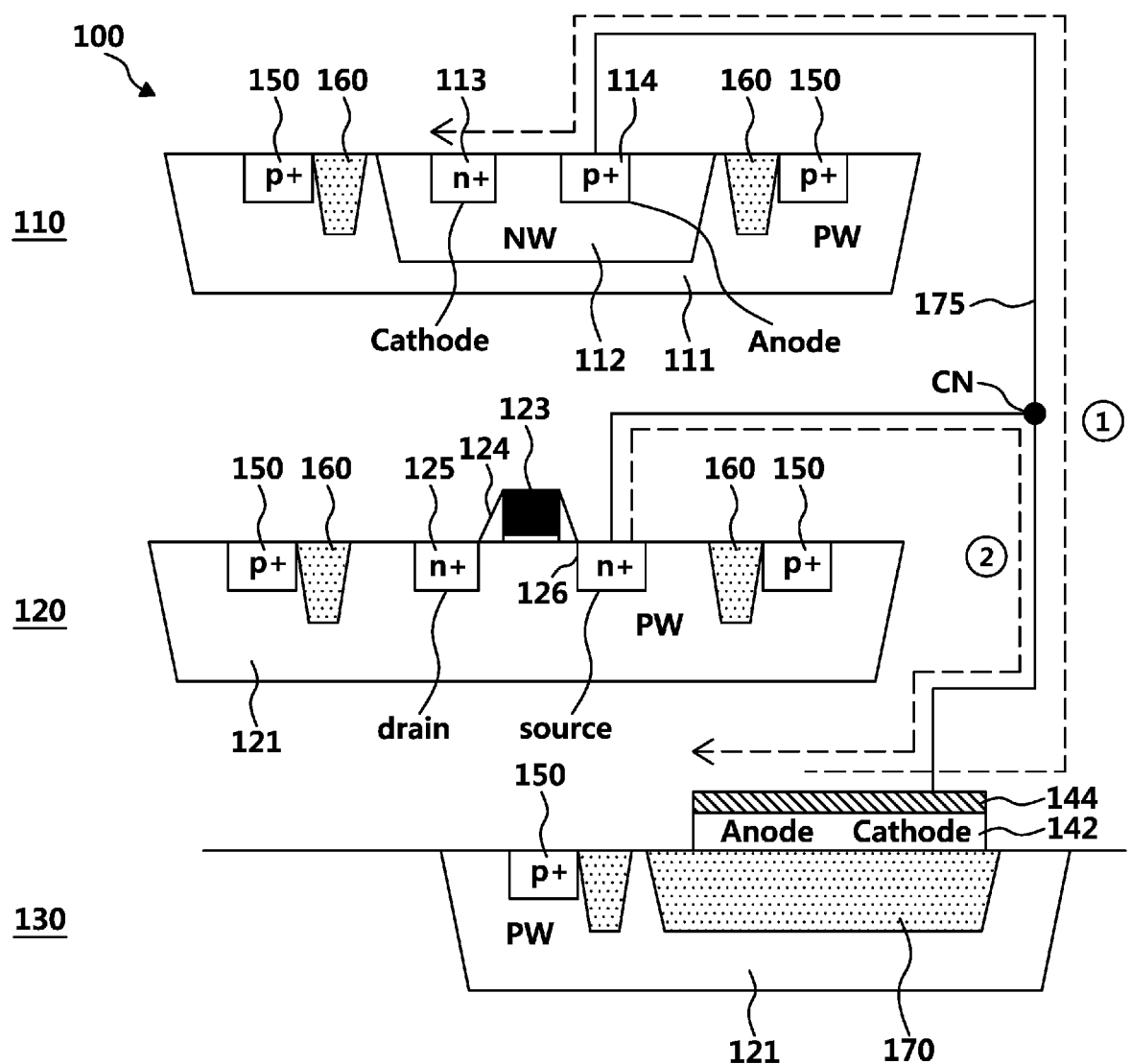
FIG. 9 illustrates a cross-sectional view of eFuse cell with read/write current paths, according to an example.

FIG. 9 illustrates a cross-sectional view of eFuse cell with read/write current paths, according to an example.

Although FIG. 9 illustrates each device arranged in a vertical direction for convenience of description, it is arranged on one semiconductor substrate, as illustrated in FIG. 1D.

As shown in FIG. 9, the PN diode 110, the cell read transistor 120, and the memory element 130 are coupled to each other. The N+ cathode 113 of the PN diode 110 is coupled to the control logic 20, and the P+ anode 114 is coupled to the n+ source region 126 of the cell read transistor 120 and the cathode of the memory element 130. The n+ drain region 125 of the cell read transistor 120 is coupled to the input line of the sense amplifier 70. In addition, the n+ source region 126 of the cell read transistor 120 is coupled to the PN diode 110 and the memory element 130. In addition, the cathode of the memory element 130, using the metal wiring 175, is coupled in the common node CN to the P+ anode 114 of the PN diode 110 and the n+ source region 126 of the cell read transistor 120.

In this configuration, the cell read transistor 120 and the shared read transistor 140 are turned off during the program operation. To program the memory element 130, programming current flows to the memory element 130. The arrow line 1 illustrates the programming current path, which indicates that it flows from the memory element 130 to the direction of the PN diode 110. Therefore, the resistance value of the memory element 130 is increased.

On the other hand, during the read operation, the cell read transistor 120 and the shared read transistor 140 are turned on. Then, the read current is output from the cell read transistor 120 and flows through the memory element 130 and is transferred to the shared read transistor 140 coupled to the bitline. The arrow line 2 illustrates the read current path.

As described above, the program operation of the semiconductor device 10 of the present disclosure passes through the PN diode 120, while the read operation does not pass through the PN diode 120, thereby providing different current flows. There is an added advantage of being able to operate with a low voltage because the current directions in the read and write operations are opposite to each other, and it is not desirable to go through the PN diode in the read operation.

Figure 10:
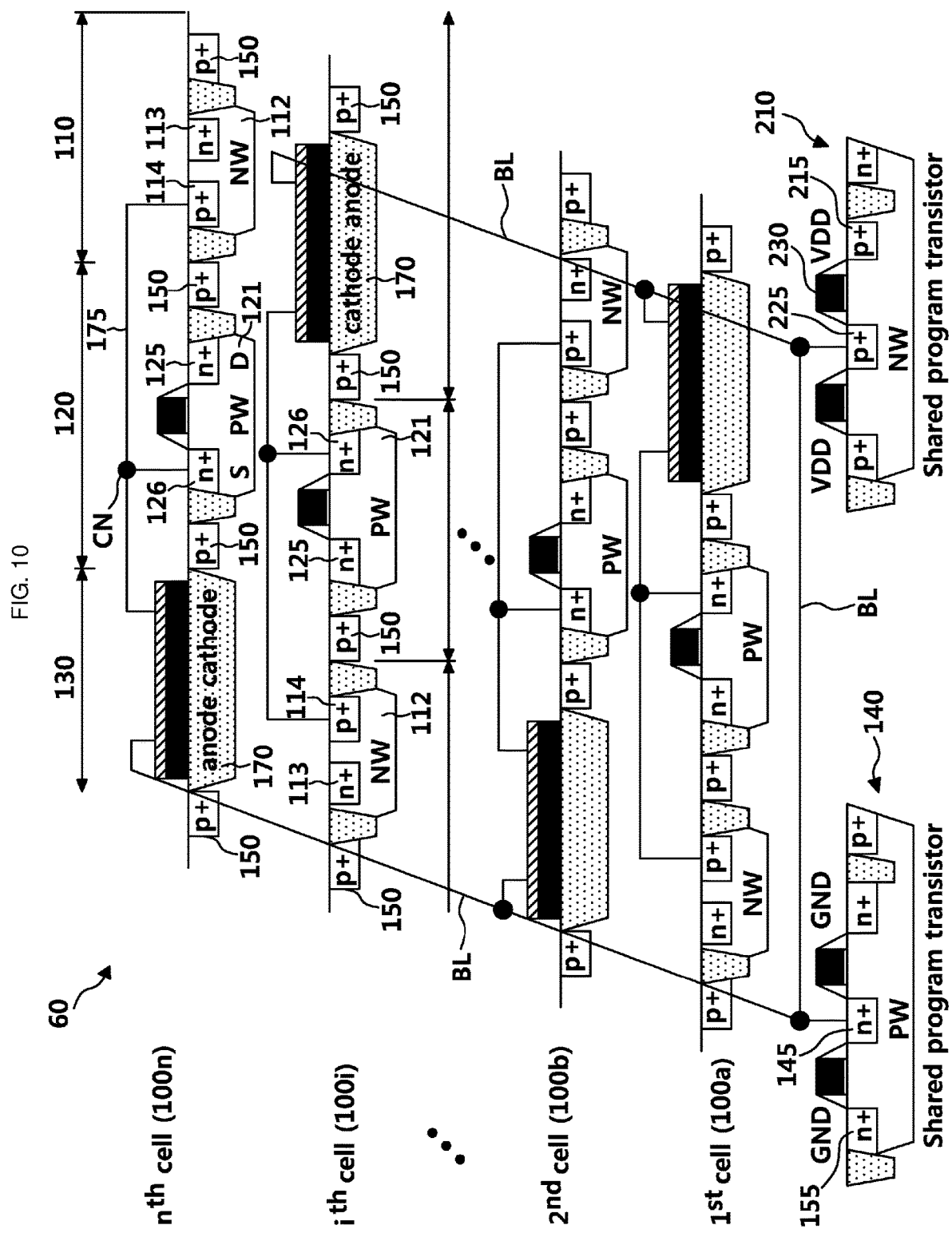
FIG. 10 illustrates a cross-sectional view of eFuse cell array, according to an example.

FIG. 10 illustrates a cross-sectional view of eFuse cell array, according to an example.

As illustrated, a plurality of unit cells 100 are arranged in a row direction, and in the example, 128 unit cells are provided in total. Each unit cell 100*a*, 100*b*, 100*i* and 100*n* has a memory element 130, a cell read transistor 120, and a PN diode 110. The unit cells 100*a*, 100*b*, 100*i* and 100*n* are alternately disposed with each other when arranged in a row direction. That is, from the left side of the drawing, the first unit cell 100*a* having a first type structure has the PN diode 110, the cell read transistor 120, and the memory element 130, in order in a first direction. The second unit cell 100*b* has an opposite arrangement, in a second direction opposite the first direction, of the three components to the first unit cell 100*a*, which is previously described in FIG. 1C. The second unit cell 100*b* having as second type structure has the memory element 130, the cell read transistor 120, and the PN diode 110, in order.

Thus, as illustrated in FIG. 10, for example, the unit cell 100*a* disposed in the first row and the 127th unit cell 100*i* disposed in the 127th row have the same structure. The arrangement order of the three devices in the unit cell 100*a* disposed in the first row and the unit cell 100*i* disposed in the 127th row are the same. Likewise, the unit cell 100*b* disposed in the second row and the last unit cell 100*n* disposed in the 128th row have the same structure. The arrangement order of the three devices in the unit cell 100*b* disposed in the second row and the last unit cell 100*n* disposed in the 128th row are the same. In other words, the arrangement orders are symmetrically structured. Accordingly, odd rows ($1^{st}$, $3^{rd}$, ..., $127^{th}$, etc.) have the same structure with each other, and even rows ($2^{nd}$, $4^{th}$, ..., $128^{th}$, etc.) have the same structure with each other. In this example, the set of unit cells disposed in odd rows ($1^{st}$, $3^{rd}$, ..., $127^{th}$, etc.) may be referred to as a unit cell group of a first type, and the set of unit cells disposed in even rows ($2^{nd}$, $4^{th}$, ..., $128^{th}$, etc.) may be referred to as a second type unit cell group.

As illustrated in FIG. 10, the PN diode 110 and the memory element 130 are disposed on the left and the right, respectively, with respect to the cell read transistor 120 in the first type unit cell 100a. However, locations of the PN diode 110 and the memory element 130 are reversed in the second type unit cell 100b compared to the first type unit cell 100a. This is because it is easy to secure a space between two N-type well regions in which the two PN diodes are formed, as previously mentioned in FIG. 1C in order to reduce the leakage current between two N-type well regions.

In detail, the N+ cathode 113 of PN diode 110 is coupled to the control logic 20, and the P+ anode 114 of PN diode 110 is coupled to the n+ source region 126 of the cell read transistor 120. The n+ drain region 125 of cell read transistor 120 is coupled to the input line of the sense amplifier 70. The n+ source region 126 of cell read transistor 120 is coupled to the PN diode 110 and the memory element 130. The cathode constituting the memory element 130 is coupled to the P+ anode 114 of the PN diode 110 and the n+ source region 126 of the cell read transistor 120.

In FIG. 10, the shared read transistor 140 is coupled to the anode of the memory element 130 through the bitline BL, and the shared program transistor 210 of the programming current controller 200 is also coupled to the anode of the memory element 130 through the bitline BL. A source 155 of shared read transistor 140 may be configured to receive reference voltage VSS or ground. An NMOS device can be used for the shared read transistor 140.

A PMOS device may be used as the shared program transistor 210. The source region 215 of shared program transistor 210 is called the program node for the eFuse array 60, and may be configured to receive program voltage VDD. A gate electrode 230 of shared program transistor 210 may be configured to receive a program signal from the NAND gate 205. In addition, a P+ drain region 225 of the shared program transistor 210 is coupled to an N+ drain region 145 of the shared read transistor 140 through the bitline BL.

According to the present example, the unit cell 100 is formed by sequentially coupling the PN diode 110, the cell read transistor 120, and the memory element 130. The unit cell 100 may have two switching transistors 120 and 140 for a read operation, but in the present example, single switching transistor (read transistor) 120 is formed in the unit cell 100. Another switching transistor (shared read transistor) 140 is provided outside of the unit cell so as to have a compact size of unit cell 100.

Accordingly, the present disclosure may provide a design for the semiconductor device 10 to have a smaller area. That is, a typical unit cell comprises two switching transistors, a PN diode and a fuse element, has a cell area of approximately 60 to 200 µm². On the other hand, the cell area of a unit cell in the present disclosure comprises one switching transistor, a PN diode, and a fuse element that may be designed to be about 20 to 55 µm². As such, the area of the semiconductor device 10 may be designed to be smaller.

According to the semiconductor device having the eFuse cell array of the present disclosure as described above, a unit cell is formed by sequentially coupling a PN diode, a cell read transistor, and a fuse. The shared read transistor involved in the read operation of the fuse element is coupled through the bitline while being located outside the unit cell. Therefore, the cell area may be reduced when compared to a typical unit cell, thereby satisfying a more stringent semiconductor device design rule.

According to the present disclosure, when stacking unit cells to form a cell array, each unit cell is stacked by being positioned in opposing directions to each other. According to the stacking direction, because each fuse of the unit cells is located spaced apart from another, it is possible to prevent the fuses of adjacent cells from being damaged by a leakage current generated in the program mode, thereby improving the reliability of the semiconductor memory device.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An eFuse cell array comprising:
    a first unit cell and a second unit cell, each comprising:
    a PN diode;
    a cell read transistor; and
    a fuse element,
    wherein a position of the PN diode in the first unit cell is diametrically opposed to a position of the PN diode in the second unit cell, and
    wherein a first placement order of the PN diode, the cell read transistor, and the fuse element in the first unit cell is reversed with respect to a second placement order of the PN diode, the cell read transistor, and the fuse element in the second unit cell.

2. The eFuse cell array of claim 1, wherein each of the first unit cell and the second unit cell further comprises:
    a write wordline coupled to a cathode of the PN diode;
    a read wordline coupled to a gate of the cell read transistor; and
    a bitline coupled to an anode of the fuse element.

3. The eFuse cell array of claim 1, wherein in each of the first unit cell and the second unit cell, a source region of the cell read transistor, an anode of the PN diode and a cathode of the fuse element are coupled to each other through a common node.

4. The eFuse cell array of claim 1, wherein a position of the fuse element in the first unit cell is diametrically opposed to a position of the fuse element in the second unit cell.

5. The eFuse cell array of claim 1, further comprising:
    a shared read transistor electrically coupled to each of the fuse elements in the first unit cell and the second unit cell,
    wherein the cell read transistor and the shared read transistor are NMOS transistors.

6. The eFuse cell array of claim 1, further comprising:
    a shared program transistor electrically coupled to each of the fuse elements in the first unit cell and the second unit cell,
    wherein the shared program transistor is a PMOS transistor.

7. The eFuse cell array of claim 5, wherein each of the fuse elements in the first unit cell and the second unit cell is further electrically coupled to the shared read transistor.

8. The eFuse cell array of claim 1, wherein the PN diode comprises:

an N-type doped region in an N-type well region;
a P-type doped region in the N-type well region;
a trench isolation region surrounding the N-type well region; and
a P-type guard ring structure surrounding the trench isolation region.

9. The eFuse cell array of claim 8, wherein the cell read transistor comprises:
a source region and a drain region in a well region;
a gate insulating layer and a gate electrode disposed between the source region and the drain region,
wherein the source region is electrically coupled to the P-type doped region of the PN diode.

10. The eFuse cell array of claim 9, wherein the fuse element comprises:
a Poly-Si layer formed on an isolation region; and
a silicide layer formed on the Poly-Si layer,
wherein a cathode of the fuse element is electrically coupled to the P-type doped region of the PN diode and the source region of the cell read transistor.

11. An eFuse cell array comprising:
a write wordline configured for a write operation;
a read wordline configured for a read operation;
a bitline disposed orthogonally to the write wordline and the read wordline;
a PN diode coupled to the write wordline;
a cell read transistor coupled to the read wordline; and
a fuse element coupled to the bitline.

12. The eFuse cell array of claim 11, wherein the write wordline is coupled to a cathode of the PN diode, the read wordline is coupled to a gate of the cell read transistor, and the bitline is coupled to an anode of the fuse element.

13. The eFuse cell array of claim 11, wherein a source region of the cell read transistor, an anode of the PN diode, and a cathode of the fuse element are coupled to each other through a common node.

14. The eFuse cell array of claim 11, further comprising:
a shared read transistor coupled to the fuse element for read operation, wherein a read current flows through the cell read transistor, the fuse element, and the shared read transistor.

15. The eFuse cell array of claim 14, further comprising:
a shared program transistor coupled to the fuse element to provide a programming current to the fuse element,
wherein the programming current flows through the shared program transistor, the fuse element and the PN diode, such that the programming current has a current path opposite to that of the read current on the fuse element.

16. The eFuse cell array of claim 11, further comprising:
a sense amplifier configured to determine whether the fuse element is programmed.

17. The eFuse cell array of claim 11, further comprising:
a read current supplier configured to provide a read current, wherein the read current supplier comprises:
a read current transistor; and
a read current resistor coupled to the read current transistor.

18. The eFuse cell array of claim 17, further comprising:
a reference voltage supplier configured to supply a reference voltage,
wherein the reference voltage supplier comprises:
a first reference transistor corresponding to the read current transistor; and
a first reference resistor corresponding to the read current resistor.

19. The eFuse cell array of claim 18, wherein the reference voltage supplier further comprises:
a second reference transistor corresponding to the cell read transistor;
a second reference resistor corresponding to the fuse element; and
a third reference transistor corresponding to the shared read transistor.

20. The eFuse cell array of claim 11, wherein the PN diode comprises:
an N-type doped region in an N-type well region;
a P-type doped region in the N-type well region;
a trench isolation region surrounding the N-type well region; and
a P-type guard ring structure surrounding the trench isolation region.

21. The eFuse cell array of claim 20, wherein the cell read transistor comprises:
a source region and a drain region in a well region;
a gate insulating layer and a gate electrode disposed between the source region and the drain region, and
wherein the source region is electrically coupled to the P-type doped region of the PN diode.

22. The eFuse cell array of claim 21, wherein the fuse element comprises:
a Poly-Si layer formed on an isolation region; and
a silicide layer formed on the Poly-Si layer, and
wherein a cathode of the fuse element is electrically coupled to the P-type doped region of the PN diode and the source region of the cell read transistor.

23. The eFuse cell array of claim 11, further comprising:
a wordline driver configured to select one of wordlines in the cell array;
a program driver configured to provide a programming current to the fuse element; and
a control logic configured to control the wordline driver and the program driver.

24. An eFuse cell array comprising:
a memory element coupled to a bitline;
a PN diode configured to couple the memory element to a write wordline;
a cell read transistor coupled to the memory element and a gate of the cell read transistor coupled to a read wordline;
a shared read transistor configured to couple the memory element through the bitline to a ground; and
a shared program transistor coupled to the memory element through the bitline.

25. The eFuse cell array of claim 24, further comprising a common node to which a source region of the cell read transistor, an anode of the PN diode, and a cathode of the memory element are coupled.

26. The eFuse cell array of claim 24, wherein the write wordline is coupled to a cathode of the PN diode, and the bitline is coupled to an anode of the memory element.

27. The eFuse cell array of claim 24, wherein the memory element is a one-time programmable (OTP) memory element, and is one of a fuse or an anti-fuse.

28. An eFuse cell array comprising:
a plurality of unit cells each comprising a memory element coupled to a bitline, a diode configured to couple the memory element to a write wordline, and a cell read transistor coupled to the memory element and a read wordline;
a shared read transistor configured to couple the memory element through the bitline to a ground; and a shared program transistor coupled to the memory element through the bitline, wherein a first placement order of the memory element, the cell read transistor, and the diode in odd ones of the plurality of unit cells is reversed with respect to a second placement order of the memory element, the cell read transistor, and the diode in even ones of the plurality of unit cells.

29. The eFuse cell array of claim 28, wherein the write wordline is coupled to a cathode of the diode, the read wordline is coupled to a gate of the cell read transistor, and the bitline is coupled to an anode of the memory element.

30. The eFuse cell array of claim 28, wherein in each of the plurality of unit cells, a source region of the cell read transistor, an anode of the diode, and a cathode of the memory element are coupled to each other through a common node.

* * * * *